(12) United States Patent
Watanabe et al.

(10) Patent No.: US 7,258,466 B2
(45) Date of Patent: Aug. 21, 2007

(54) LIGHTING UNIT

(75) Inventors: Shigeyuki Watanabe, Shizuoka (JP); Hironori Tsukamoto, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 78 days.

(21) Appl. No.: 11/039,863

(22) Filed: Jan. 24, 2005

(65) Prior Publication Data

US 2005/0180157 A1 Aug. 18, 2005

(30) Foreign Application Priority Data

Jan. 23, 2004 (JP) ............ P.2004-016121

(51) Int. Cl.
*F21V 29/00* (2006.01)

(52) U.S. Cl. .......... 362/294; 362/545; 362/543; 362/373; 362/547

(58) Field of Classification Search ........ 362/294, 362/545, 543, 373, 547
See application file for complete search history.

(56) References Cited

U.S. PATENT DOCUMENTS

| | | | |
|---|---|---|---|
| 6,152,590 A | 11/2000 | Fürst et al. | |
| 6,531,328 B1 | 3/2003 | Chen | |
| 6,582,100 B1 * | 6/2003 | Hochstein et al. | 362/294 |
| 6,773,154 B2 * | 8/2004 | Desai | 362/541 |
| 6,874,910 B2 * | 4/2005 | Sugimoto et al. | 362/294 |
| 6,999,318 B2 * | 2/2006 | Newby | 361/719 |

FOREIGN PATENT DOCUMENTS

| | | |
|---|---|---|
| EP | 1 367 870 A1 | 12/2003 |
| FR | 2 739 524 A1 | 4/1997 |
| JP | 6-89601 A | 3/1994 |
| JP | 2002-170404 A | 6/2002 |
| WO | WO 03/066374 A2 | 8/2003 |

* cited by examiner

*Primary Examiner*—Renee Luebke
*Assistant Examiner*—Evan Dzierzynski
(74) *Attorney, Agent, or Firm*—Sughrue Mion, PLLC

(57) ABSTRACT

A lighting unit for a vehicle includes a light emitting diode unit, a plate-shaped radiating board having an upper surface to which the light emitting diode unit is directly fixed, and a feeding connector connected electrically to the light emitting diode unit at the end of the radiating board and having an input portion for a power to be supplied to the light emitting diode unit below the radiating board. The feeding connector is provided on the end of the radiating board and there may further be provided a wiring extended from the light emitting diode unit toward the end of the radiating board over the upper surface of the radiating board and connected to the feeding connector at the end.

11 Claims, 21 Drawing Sheets

LIGHTING UNIT

This application claims foreign priority under 35 USC 119 based on Japanese Patent Application No. 2004-016121, filed on Jan. 23, 2004, the contents of which is incorporated herein by reference. The foreign priority claim is being made concurrently with the filing of this application.

BACKGROUND OF THE INVENTION

1. Technical Field

The present invention relates to a lighting unit. More particularly, the invention relates to a lighting unit using a semiconductor light emitting unit as a light source.

2. Background Art

In a lighting unit for a vehicle, for example, a headlamp for a vehicle, it is necessary to form a light distribution pattern with high precision in respect of a safety. The light distribution pattern is formed by an optical system using a reflecting mirror or a lens, for example (see JP-A-6-89601 Publication (Pages 3 to 7, FIGS. 1 to 14)). In recent years, it has been investigated to utilize a semiconductor light emitting unit for a light source of a headlamp for a vehicle.

In the case in which a semiconductor light emitting unit is used as the light source of a lighting unit, it is necessary to satisfy a light amount level required for the lighting unit by maximizing the light emission of the semiconductor light emitting unit. Accordingly, there is a related art problem in that it is necessary to eliminate a factor for intercepting a light emitted from the semiconductor light emitting unit, and furthermore, to prevent luminance from being reduced by heat.

Moreover, the semiconductor light emitting unit is small-sized. For this reason, a light emitting region is narrower than that in a conventional light source. Therefore, there is a related art problem in that it is necessary to maintain a relative position with an optical system with higher precision than that in the conventional art to form a light distribution pattern with high precision.

SUMMARY OF THE INVENTION

A first aspect of the invention is directed to a lighting unit to be used for an illumination comprising a semiconductor light emitting unit, a plate-shaped radiating board having an upper surface to which the semiconductor light emitting unit is directly fixed, and a feeding connector having an input portion connected electrically to the semiconductor light emitting unit at an end on the upper surface of the radiating board and serving to input a power to be supplied to the semiconductor light emitting unit below the radiating board.

The feeding connector is provided on the end of the radiating board and there may be further provided a wiring extended from the semiconductor light emitting unit toward the end of the radiating board over the upper surface of the radiating board and connected to the feeding connector at the end.

There may be further provided a feeding contact point formed on an upper surface at the end of the radiating board and serving to supply a power to the semiconductor light emitting unit, and the feeding connector may hold the feeding contact point portion of the radiating board, thereby carrying out an electrical connection to the feeding contact point.

There may be provided a plurality of semiconductor light emitting units fixed to the upper surface of the radiating board and connected in series, and the feeding connector may supply the power to both ends of wirings of the semiconductor light emitting units.

The radiating board may have, on a side surface, a positioning projection having a relative position with the semiconductor light emitting unit which is well known. It is desirable that the positioning projection should have a relative position with a center of a light emitting region of the semiconductor light emitting unit which is well known.

The summary of the invention does not list all necessary features of the invention but the subcombination of these feature groups can also be the invention.

DETAILED DESCRIPTION OF THE INVENTION

While the invention will be described below with reference to an embodiment of the invention, the following embodiment is not restricted to the invention according to the claims and all of the combinations of features described in the embodiment are not indispensable to means for solving the invention.

Figure 1:
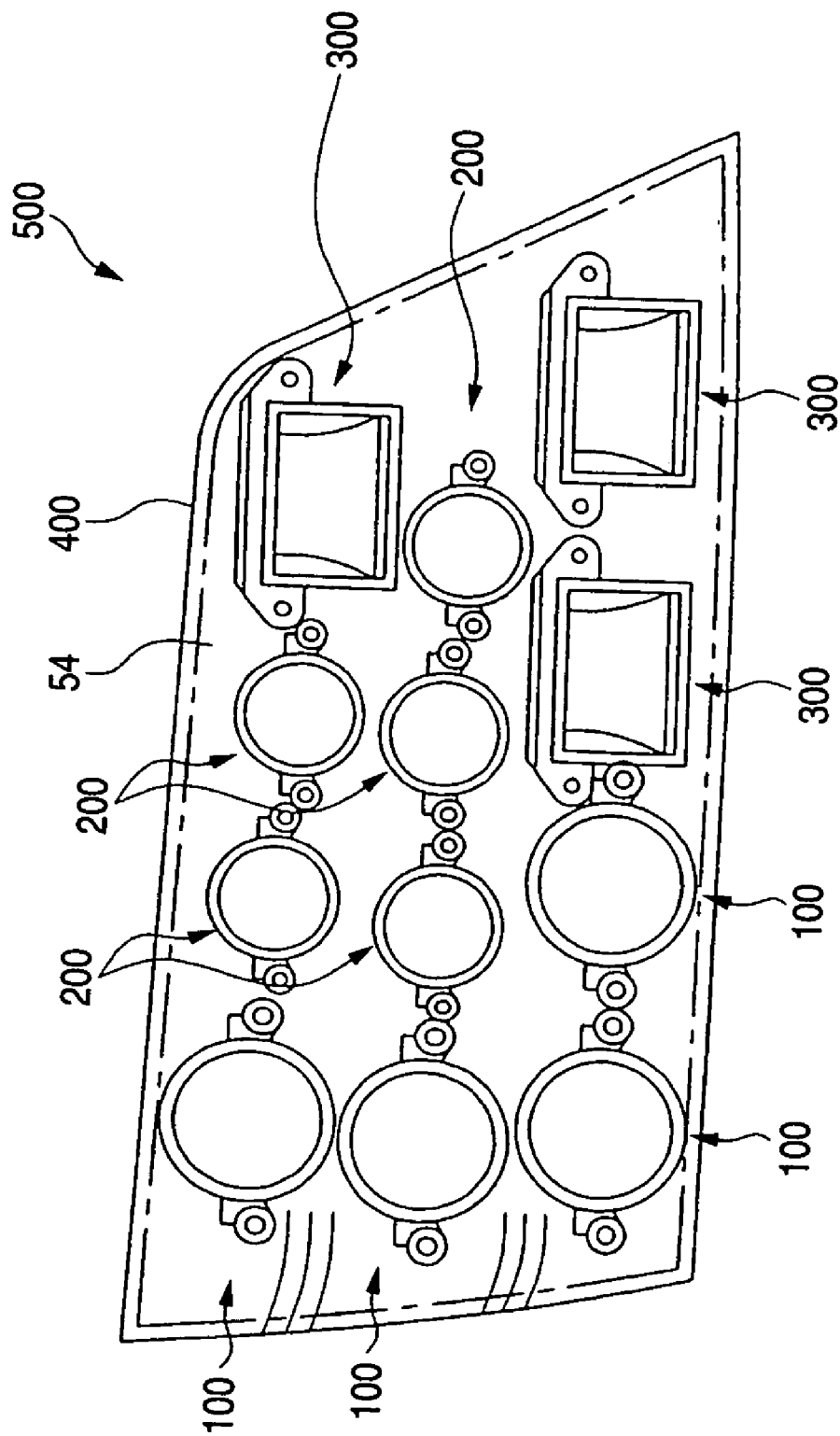
FIG. 1 is a front view showing a lighting unit for a vehicle according to an exemplary, non-limiting embodiment of the present invention.
Figure 2:
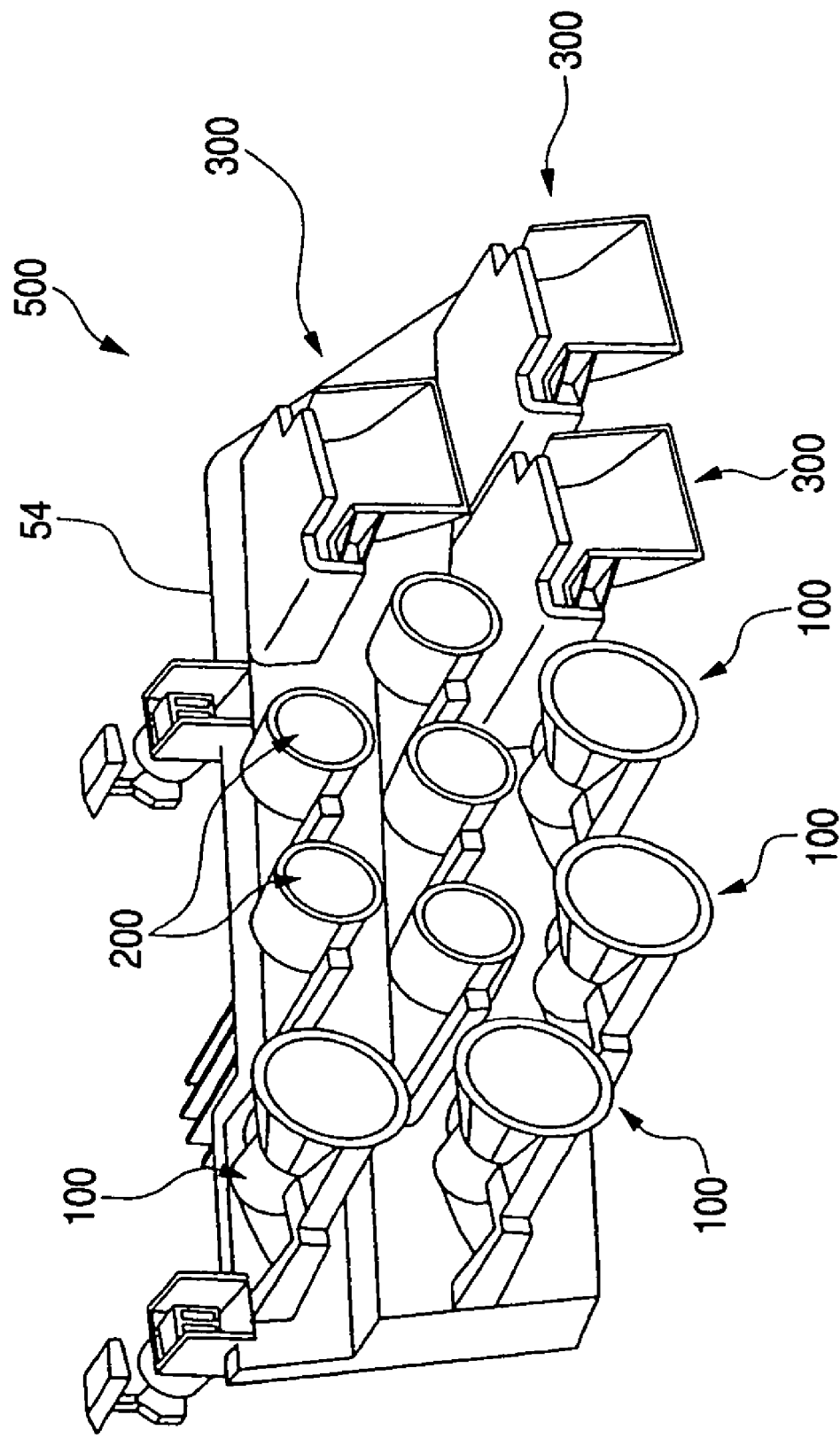
FIG. 2 is a perspective view showing the lighting unit according to an exemplary, non-limiting embodiment of the present invention for a vehicle as seen from an obliquely forward part.
Figure 3:
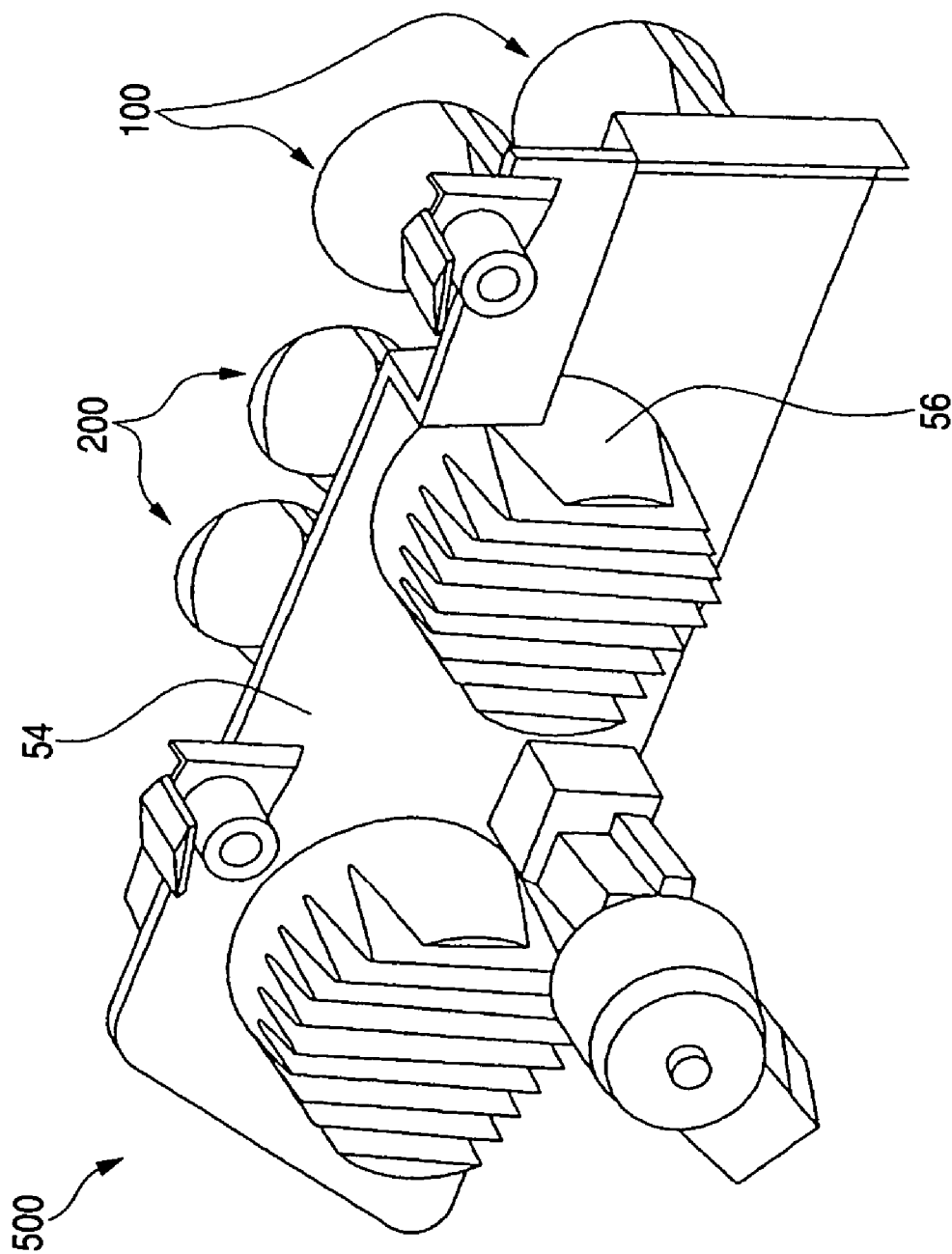
FIG. 3 is a perspective view showing the lighting unit according to an exemplary, non-limiting embodiment of the present invention for a vehicle as seen from an obliquely rearward part.

FIGS. 1 to 3 show an example of the structure of a lighting unit 500 for a vehicle according to an embodiment of the invention. FIG. 1 is a front view showing the lighting unit 500 for a vehicle. FIG. 2 is a perspective view showing the lighting unit 500 for a vehicle in a state in which a cover 400 illustrated in FIG. 1 is removed as seen from an obliquely forward part. FIG. 3 is a perspective view showing the lighting unit 500 for a vehicle illustrated in FIG. 2 as seen from an obliquely rear part. In the embodiment, longitudinal, transverse and vertical directions are substantially coincident with the longitudinal, transverse and vertical directions of the vehicle, respectively.

The lighting unit 500 for a vehicle is a headlamp for a low beam irradiation, for example, and a plurality of light source units (100, 200, 300) is accommodated in a lamp housing constituted by the transparent cover 400 and a bracket 54. The light source unit is classified into the first light source unit 100 taking a substantially round shape and having a comparatively large diameter, the second light source unit 200 taking a substantially round shape and having a comparatively small diameter, and the third light source unit 300 taking a substantially square shape which is long in the transverse direction. Each of the light source units has, as a light source, a light emitting diode unit which will be described below, and irradiates a light generated from the light emitting diode unit onto the forward part of the vehicle. The light emitting diode unit is an example of the semiconductor light emitting unit according to the present invention. For the semiconductor light emitting unit, a laser diode maybe used in addition to the light emitting diode unit, for example but not by way of limitation.

The light source units are attached to the bracket 54 so as to be turned downward at approximately 0.5 to 0.6 degree with respect to the forward part of the vehicle. The bracket 54 is attached to the lighting unit 500 for a vehicle so as to be tiltable by means of an aiming mechanism for regulating the direction of the optical axis of the light source unit. The light source units (100, 200, 300) have light distribution patterns for each type and form a light distribution pattern required for the lighting unit 500 for a vehicle.

A plurality of heat sinks 56 is provided on the back face of the bracket 54. The heat sink 56 is formed by a material having a higher thermal conductivity than that of a metal, ceramic or a resin, and absorbs a heat from each of the light source units (100, 200, 300) and radiates the heat.

Figure 4:
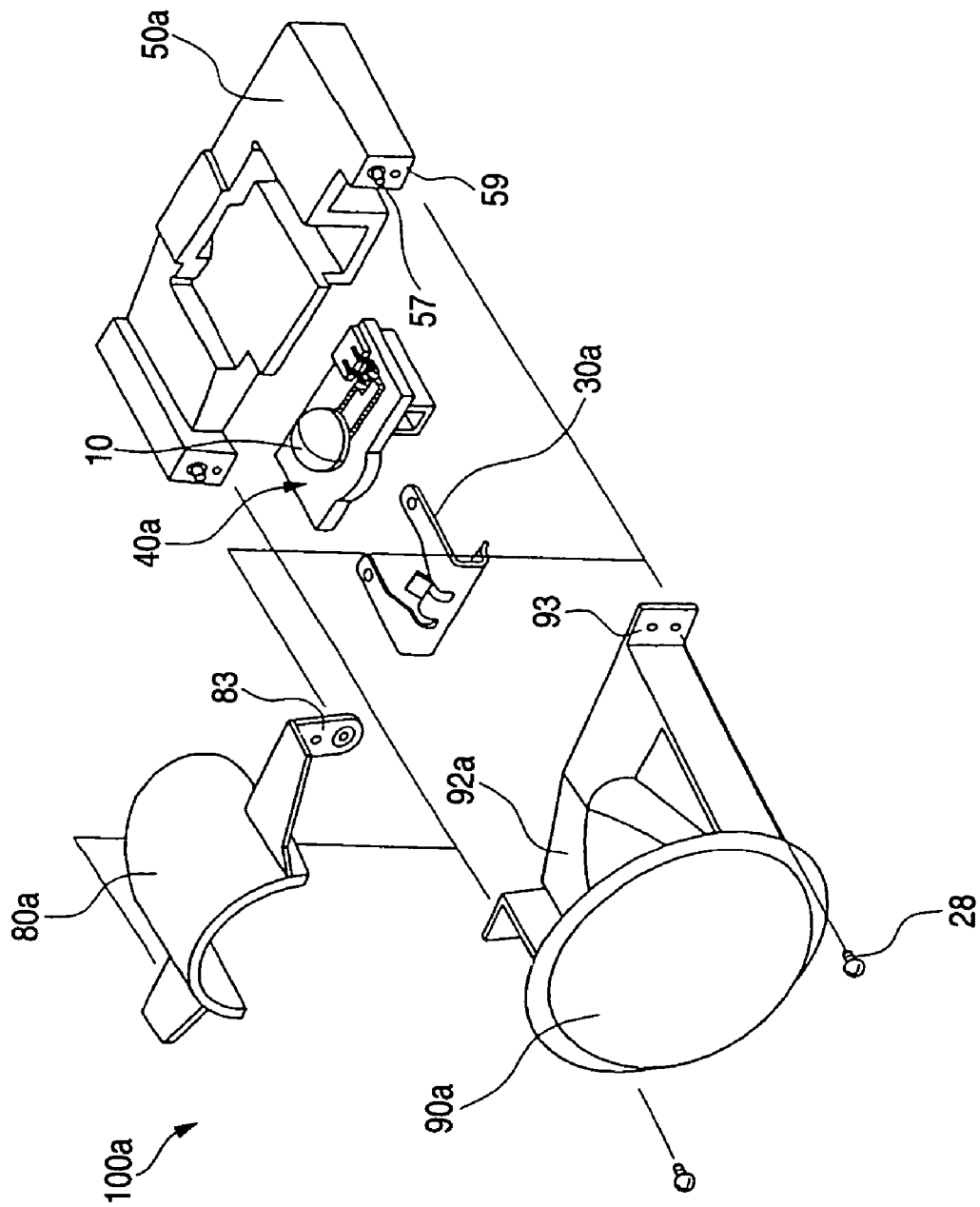
FIG. 4 is an exploded perspective view showing a first light source unit according to an exemplary, non-limiting embodiment of the present invention.

FIG. 4 is an exploded perspective view showing the first light source unit 100a. The first light source unit 100a is constituted to intensively irradiate a comparatively small range in the light distribution pattern of the lighting unit 500 for a vehicle. The first light source unit 100a includes an LED module 40a on which a light emitting diode unit 10 is mounted, an LED base 50a for putting the LED module 40a thereon and regulating left, right and rear positions, a clip 30a for fixing the LED module 40a to the LED base 50a, a reflector 80a for reflecting a light emitted from the light emitting diode unit 10 to the forward part of the lighting unit, a lens 90a for projecting the light reflected by the reflector 80a onto the forward part of the lighting unit, and a screw 28 for fastening the reflector 80a and the lens 90a to the LED base 50a together.

The reflector 80a is a substantially dome-shaped member fixed to a portion placed above the light emitting diode unit 10, and has a reflecting plane taking the shape of a substantially elliptic spherical surface with the optical axis of the first light source unit 100a to be a central axis on an inside thereof. More specifically, the reflecting plane is formed such that a section including the optical axis of the first light source unit 100a takes an about ¼ elliptical shape with one point placed rearward apart from the light emitting diode unit 10 set to be a common vertex. By such a shape, the reflector 80a collects and reflects the light emitted from the light emitting diode unit 10 forward close to the optical axis of the lens 90a. The lens 90a includes a shade 92a on the LED module 40a side. The shade 92a shields or reflects a part of the light reflected by the reflector 80a, thereby causing a beam forming the light distribution pattern of the first light source unit 100a to be incident on a lens portion.

The LED base 50a has an assembling reference plane 59 for determining positions in the direction of the optical axis of the reflector 80a and the lens 90a with respect to the direction of the irradiation of the lighting unit 500 for a vehicle with high precision with respect to the LED base 50a, and a positioning projection 57 protruded from the assembling reference plane 59 substantially perpendicularly. The positioning projection 57 determines the positions of the reflector 80a and the lens 90a in a perpendicular direction to the optical axis with high precision.

Thus, the LED module 40a, the reflector 80a and the lens 90a are all positioned with high precision with respect to the LED base 50a. Consequently, the relative positions of the reflector 80a and the lens 90a with respect to the LED module 40a are also determined with high precision. Accordingly, a light generated from the light emitting diode unit 10 is incident on the lens 90a with high precision and a light distribution pattern with high precision can be formed in the forward part of the vehicle. The LED base 50a is an example of a housing according to the present invention. Moreover, the reflector 80a and the lens 90a are an example of an optical member according to the present invention.

Figure 5:
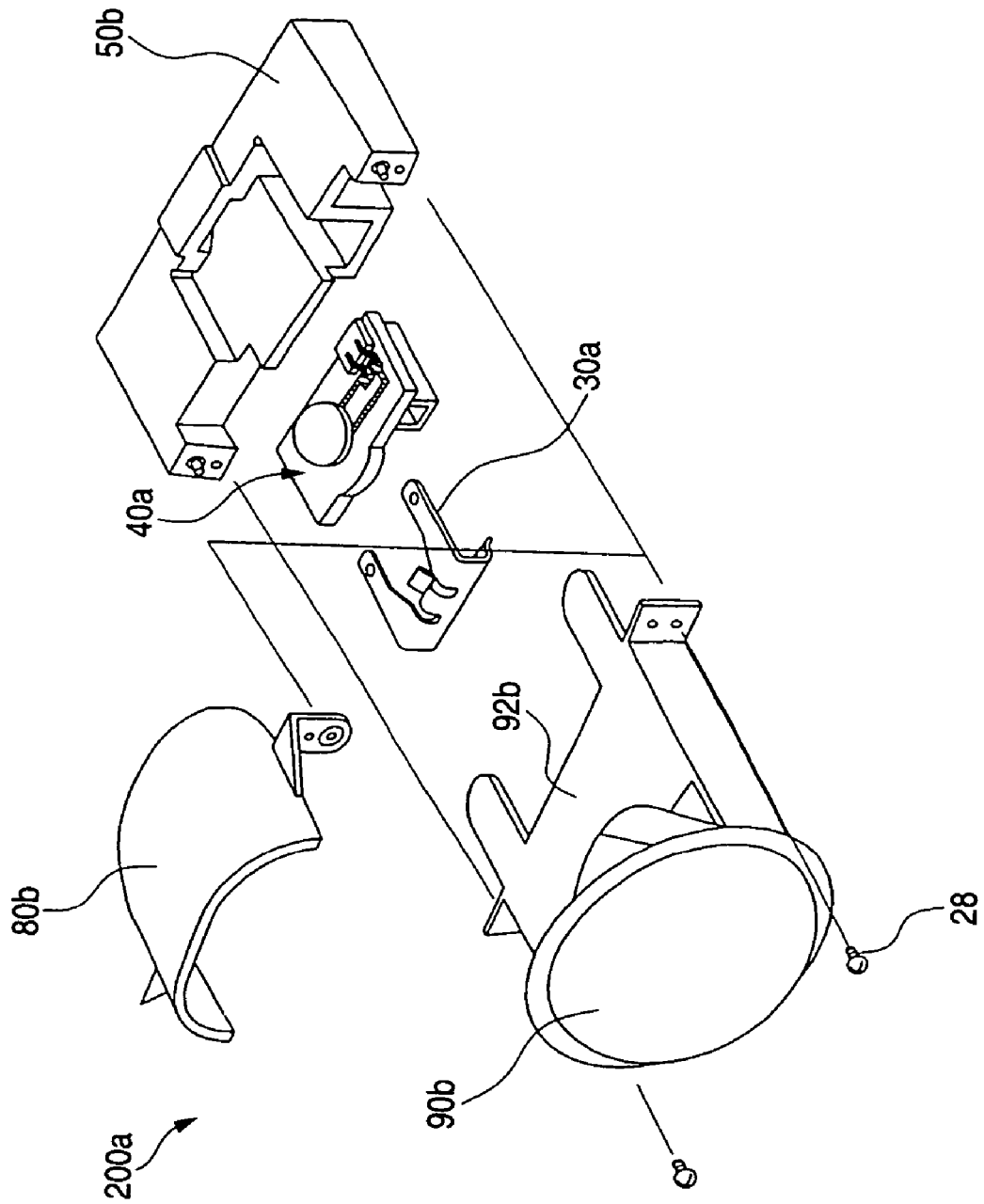
FIG. 5 is an exploded perspective view showing a second light source unit according to an exemplary, non-limiting embodiment of the present invention.

FIG. 5 is an exploded perspective view showing a second light source unit 200a. In the second light source unit 200a, the shapes of a reflector 80b and a lens 90b are set and the relative positions of the reflector 80b and the lens 90b with respect to the light emitting diode unit 10 are determined to irradiate a wider range in the light distribution pattern of the lighting unit 500 for a vehicle than that of the first light source unit 100a.

Figure 6:
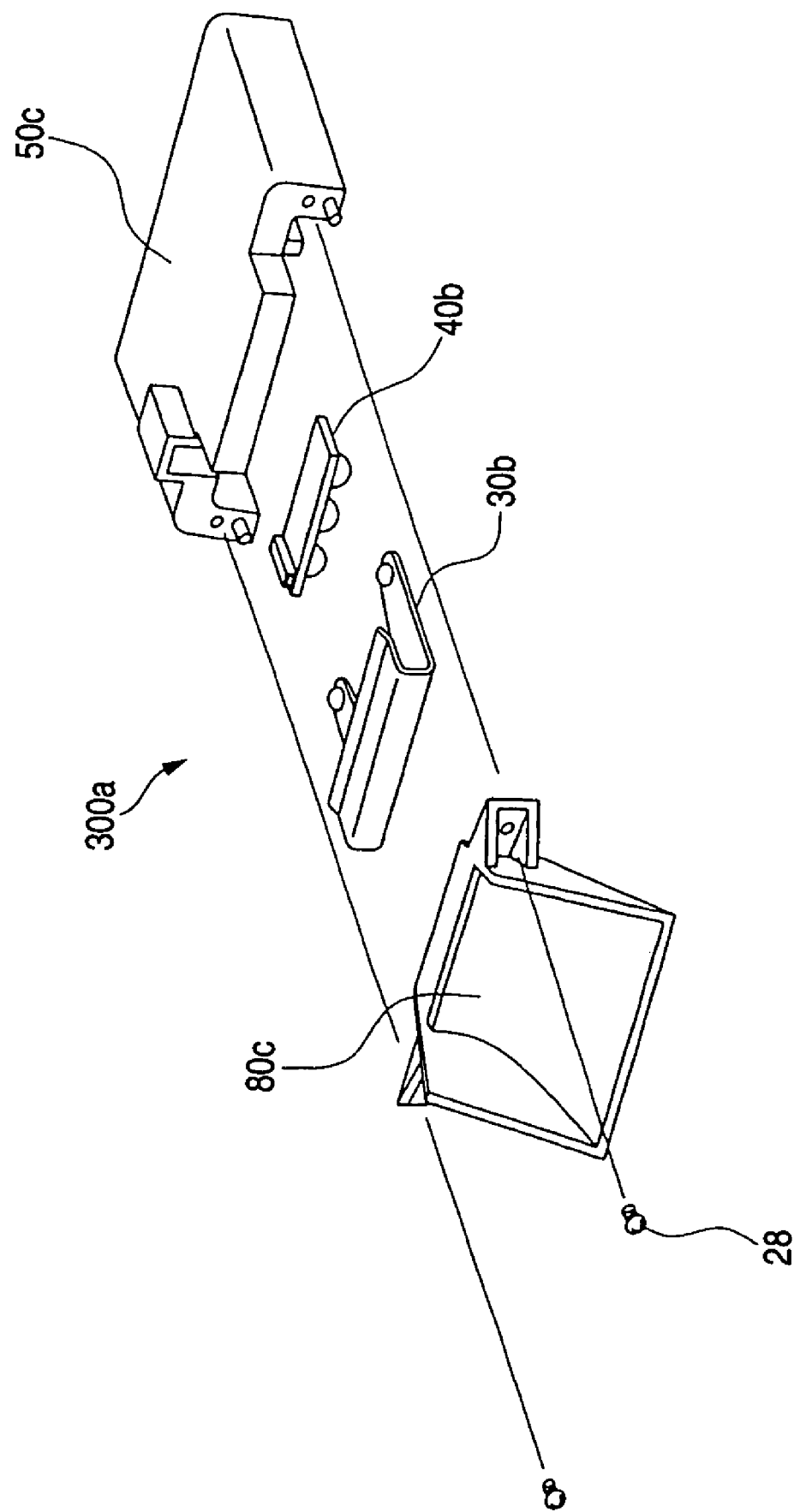
FIG. 6 is an exploded perspective view showing a third light source unit according to an exemplary, non-limiting embodiment of the present invention.

FIG. 6 is an exploded perspective view showing a third light source unit 300a. The third light source unit 300a is constituted to irradiate the widest range in a transverse direction in the light distribution pattern of the lighting unit 500 for a vehicle. The third light source unit 300a has a substantially oblong LED module 40b having a plurality of light emitting diode units 10 arranged and mounted in a line on either side, an LED base 50c for putting the LED module 40b thereon downward in the transverse direction, a clip 30b for fixing the LED module 40b to the lower surface of the LED base 50c, and a reflector 80c for irradiating a light emitted downward from the light emitting diode unit 10 onto the forward part of the lighting unit 500 for a vehicle.

The inner reflecting plane of the reflector 80c is formed to take a substantially ¼ elliptical shape in which a vertical section in the longitudinal direction of the lighting unit 500 for a vehicle is provided over the whole area of an internal surface and a portion coming in contact with the LED base 50c behind the light emitting diode unit 10 is set to be the vertex of a major axis. By such a shape, the reflector 80c irradiates the lights emitted from a plurality of light emitting diode units 10 arranged in the transverse direction onto the widest range in the transverse direction of the light distribution pattern of the lighting unit 500 for a vehicle, and furthermore, collects the lights into a constant range which is narrower in a vertical direction than that in the transverse direction.

Figure 7:
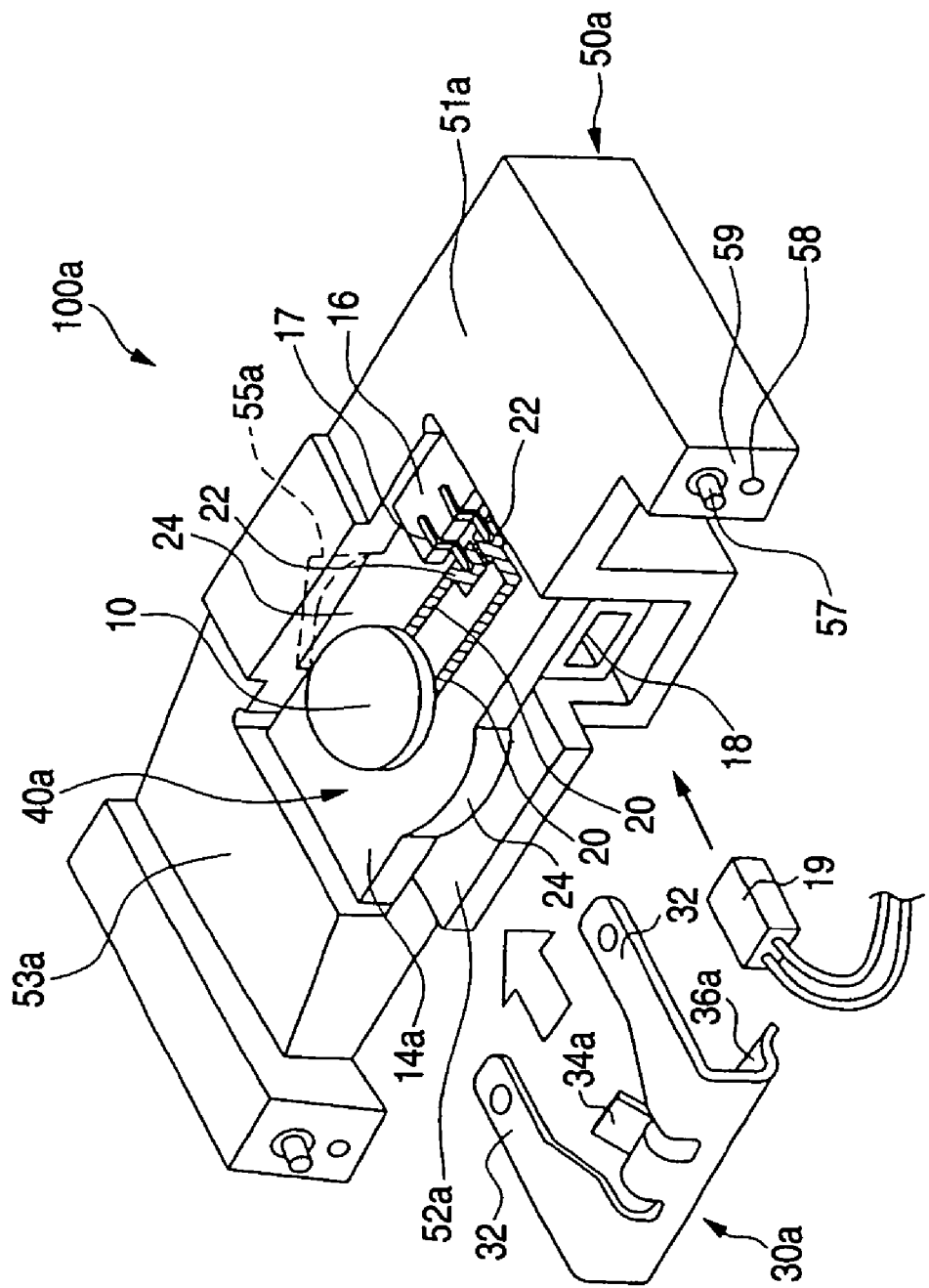
FIG. 7 is a view showing a first example of a method of fixing a light emitting diode unit and feeding a power.

FIG. 7 shows a first example of a method of fixing the light emitting diode unit 10 and feeding power. The light emitting diode unit 10 is directly fixed to the upper surface of a plate-shaped radiating board 14a. The radiating board 14a is an example of a radiating board mainly formed by a material having a high thermal conductivity such as a metal or ceramic (but not limited thereto) and transfers a heat generated on the light emitting diode unit 10 to the LED base 50a. The radiating board 14a efficiently radiates the heat of the light emitting diode unit 10 to an LED base 50, thereby preventing the amount of the light emission of a light emitting diode unit 10a from being reduced by the heat.

A wiring 20 extended from the light emitting diode unit 10 toward the end of the radiating board 14a is formed on the upper surface of the radiating board 14a. A feeding contact point 22 for supplying a power to the light emitting diode unit 10 is formed on the end of the wiring 20 and a feeding connector 16 to be electrically connected to the feeding contact point 22 is incorporated in the end of the radiating board 14a.

A method of forming the wiring 20 and the feeding contact point 22 on the radiating board 14a is varied depending on whether the radiating board 14a is a conductor. For example, when the radiating board 14a is a metal such as copper, an insulating layer is first formed on the upper surface of the board by a method such as painting. Then, a mask opened to take the shapes of the wiring 20 and the feeding contact point 22 is covered, and a conductive paste is applied to form the wiring 20 and the feeding contact point 22. Alternatively, they may be formed by providing an insulating layer and a conductive layer on the upper surface of the board in this order, and selectively etching the conductive layer provided on a surface to remove the conductive layer other than the wiring 20 and the feeding contact point 22.

On the other hand, when the radiating board 14a is an insulator such as ceramic, a conductive layer is directly formed on a surface and then etched in the same manner as in the example described above, so that the wiring 20 and the feeding contact point 22 are formed. In this case, a step of forming an insulating layer on the surface of the radiating board 14a is not required. Consequently, it is an advantage of the present invention that cost can be reduced.

The radiating board 14a supplies a power to the light emitting diode unit 10 through only a wiring on a surface layer. As compared with the case in which a current is supplied to the light emitting diode unit 10 through an internal wiring such as a through hole, accordingly, the degree of storage of the heat generated from the wiring 20 in the radiating board 14a is lower. Moreover, it is not necessary to maintain a space for a wiring in the radiating board 14a. Therefore, it is possible to make the most of the performance of the radiating board 14a to be a radiating plate. Accordingly, the radiating board 14a can prevent the amount of the light emission of the light emitting diode unit 10 from being reduced by heat.

The feeding connector 16 holds the feeding contact point 22 portion of the radiating board 14a with a contact spring 17 and is connected electrically to the feeding contact point 22. Accordingly, the feeding connector 16 can implement a fixation and an electrical connection to the radiating board 14a at the substantially same time.

The feeding connector 16 has an input portion 18 for a power to be supplied to the light emitting diode unit 10 below the radiating board 14a. A feeding plug 19 for inputting the power to be supplied to the light emitting diode unit 10 is inserted into the input portion 18. Accordingly, the input portion 18 has a larger external shape than that of the feeding plug 19. On the other hand, it is sufficient that the connecting portion of the feeding connector 16 and the feeding contact point 22 is maintained to have a necessary height at a minimum to constitute the contact spring 17.

Due to the foregoing requirements, the height from the radiating board 14a necessary for the input portion 18 is greater than the height from the radiating board 14a necessary for the connection of the radiating board 14a and the feeding connector 16. Accordingly, the feeding connector 16 has its input portion 18 below the radiating board 14a and can supply power to the light emitting diode unit 10 without intercepting the light emitted from the light emitting diode unit 10.

The LED base 50a has a dent for accommodating the LED module 40a on an upper surface, and the inner part of the dent is provided with an abutment portion 55a to abut on a positioning projection 24 provided on the rear side surface of the radiating board 14a. The LED base 50a further has an extended portion 52a that extends on a forward side along the lower surface of the radiating board 14a. The clip 30a holds the radiating board 14a and the extended portion 52a at the substantially same time, thereby fixing the LED module 40a to the LED base 50a. The clip 30a is a leaf spring that has a lower surface engaging portion 36a to be engaged with the lower surface of the extended portion 52a and an upper surface pressing portion 32 for pressing the upper surface of the radiating board 14a.

It is desirable that the upper surface pressing portion 32 should be provided on both sides with the light emitting diode unit 10 interposed there between. The dent for accommodating the LED module 40a directly contacts with almost a whole portion, excluding the feeding connector 16 portion on the back face of the radiating board 14a. Consequently, the clip 30a can stably fix the LED module 40a to the LED base 50a. Furthermore, the heat generated is efficiently transferred from the light emitting diode unit 10 to the LED base 50a through the radiating board 14a. Accordingly, the amount of the light emission of the light emitting diode unit 10 can be further prevented from being reduced by the heat.

The clip 30a further has a side surface pressing portion 34a for pressing a side surface on this side of the radiating board 14a against an inner part when it holds the radiating board 14a and the extended portion 52a. The positioning projection 24 facing the inner part of the dent abuts on the abutment portion 55a so that a position in a horizontal direction is determined. Accordingly, the side surface pressing portion 34a of the clip 30a can position the radiating board 14a with respect to the LED base 50a in the horizontal direction by pressing the side surface on this side of the radiating board 14*a* against the inner part of the dent. The positioning projection 24 is processed to maintain a relative position with the light emitting diode unit 10 with high precision.

A specific processing method includes the following method. First, the light emitting diode unit 10 is mounted on the radiating board 14*a*, which is processed to take a slightly large shape of the positioning projection 24 portion. Then, the reference position of the light emitting region of the light emitting diode unit 10 which is mounted is confirmed through image recognition, and the positioning projection 24 is processed to form a circular arc setting the reference position to be its center. Thus, there is formed the positioning projection 24 having a relative position with the reference of the light emitting region of the light emitting diode unit 10 with high precision.

According to the structure described above, the reference of the light emitting region of the light emitting diode unit 10 is positioned with respect to the abutment portion 55*a* of the LED base 50*a* in a horizontal direction with high precision. The reflector 80*a* and the lens 90*a* are positioned with high precision with respect to the assembling reference plane 59 and the positioning projection 57 as described above. By managing precision in a dimension from the abutment portion 55*a* to the assembling reference plane 59 and the positioning projection 57 with high precision, accordingly, it is possible to maintain, with high precision, the relative positions in the horizontal direction of the reference position of the light emitting region of the light emitting diode unit 10 with the reflector 80*a* and the lens 90*a*.

Furthermore, the LED module 40*a* is stably fixed to the dent of the LED base 50*a* in the vertical direction. The positions of the reflector 80*a* and the lens 90*a* in the vertical direction are determined by the positioning projection 57 with high precision as described above. By managing a distance in the vertical direction from the upper surface of the dent on which the LED module 40*a* is mounted to the positioning projection 57 with high precision, accordingly, it is possible to maintain the relative positions in the vertical direction of the center of the light emitting region of the light emitting diode unit 10 with the reflector 80*a* and the lens 90*a* with high precision.

As described above, referring to both the horizontal and vertical directions of the first light source unit 100*a*, the relative positions of the light emitting region of the light emitting diode unit 10 with the reflector 80*a* and the lens 90*a* are maintained with high precision. Accordingly, the first light source unit 100*a* can irradiate the light generated from the light emitting diode unit 10 to an outside direction with high precision. Furthermore, the radiating board 14 is mainly constituted by a material having a high thermal conductivity and a low coefficient of thermal expansion, for example, a metal or ceramic. Therefore, the relative position from the light emitting diode unit 10 to the positioning projection 24 is changed with difficulty by a heat generated from the light emitting diode unit 10. Accordingly, the first light source unit 100*a* can irradiate the light generated from the light emitting diode unit 10 to the outside with substantially higher precision.

Figure 8:
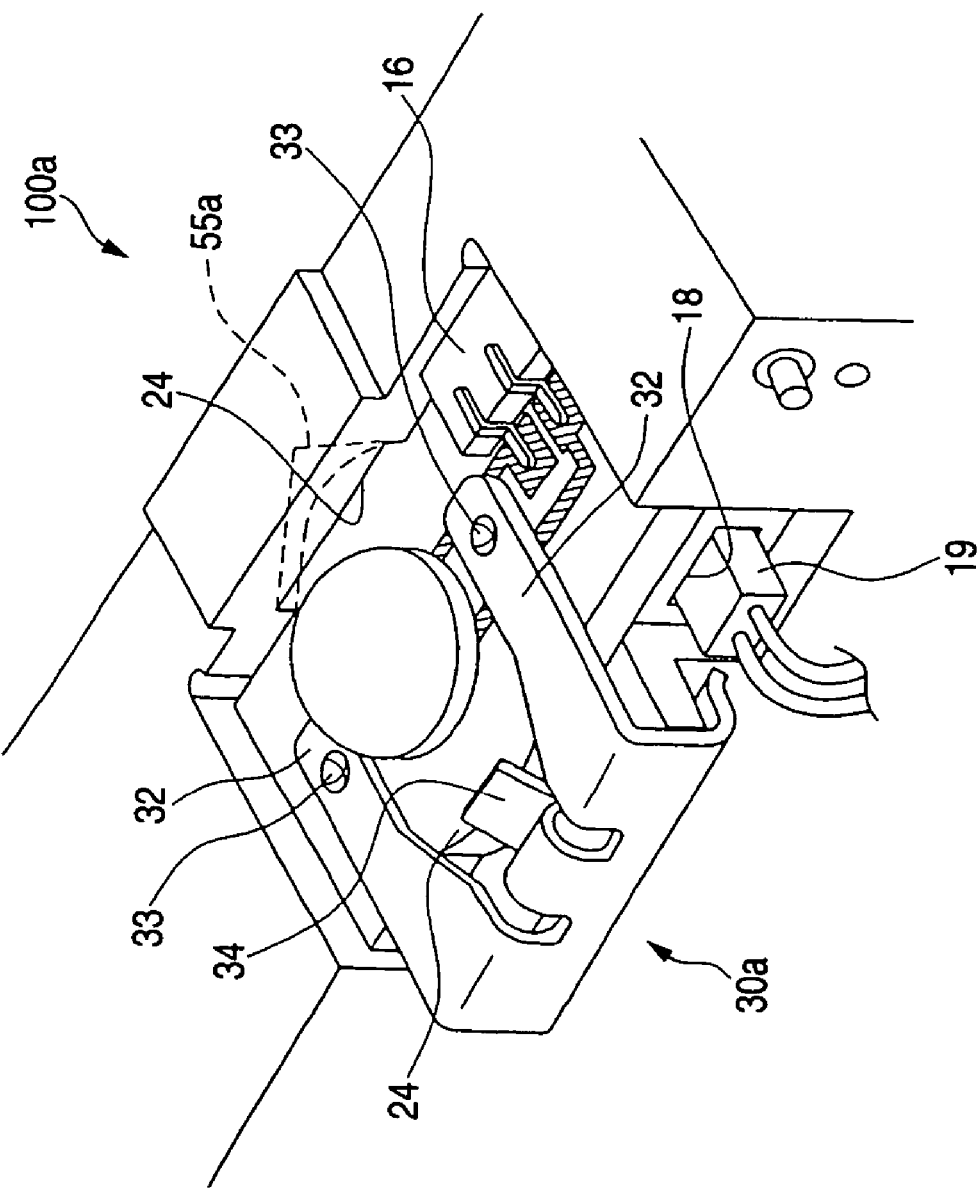
FIG. 8 is a view showing a state in which a clip is attached in the first example.

FIG. 8 shows a state in which the clip 30*a* is attached to the LED module 40*a* and the LED base 50*a*. A bump 33 protruded in the direction of the radiating board 14*a* is formed in the vicinity of the tip of the upper surface pressing portion 32. The bump 33 is processed by carrying out plastic deforming over a part of the upper surface pressing portion 32 substantially semispherically and downward. The upper surface pressing portion 32 contacts the radiating board 14*a* at only the vertex of the bump 33 facing the radiating board 14*a*, and the other portions have a clearance together with the radiating board 14*a*. The wiring 20 for supplying a power to the light emitting diode unit 10 is formed in a position in which it does not contact the bump 33 with the clip 30*a* assembled completely. Thus, even if the clip 30*a* is constituted by a conductor such as a metal, the wiring 20 can be prevented from being short-circuited. The upper surface pressing portion 32 comes in contact with the radiating board 14 at only the vertex of the bump 33. Therefore, the degree of freedom of a position in which the wiring 20 is to be formed is high.

Figure 9:
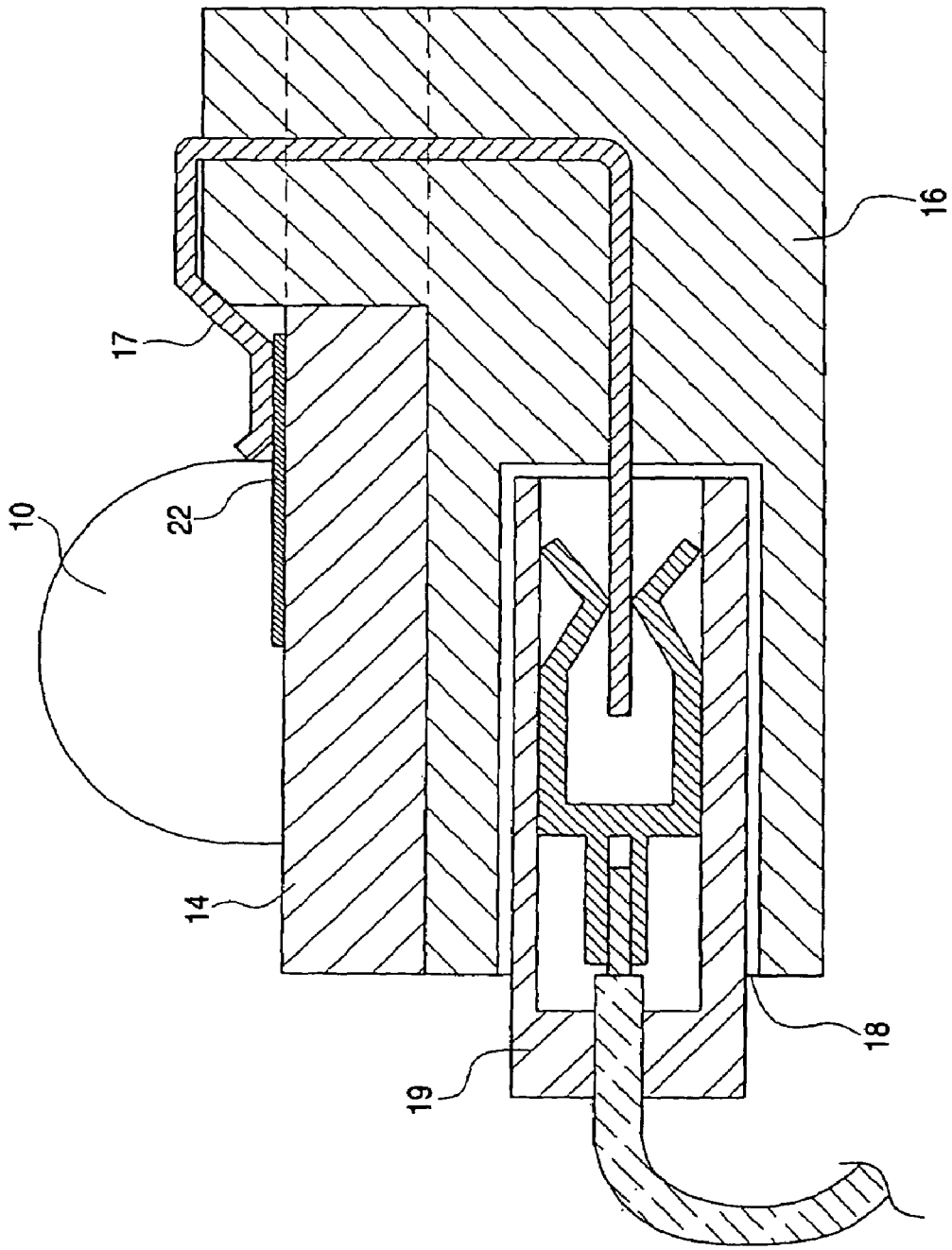
FIG. 9 is a vertical sectional view showing a feeding connector portion in FIG. 8 cut away in a longitudinal direction.

FIG. 9 is a vertical sectional view showing the feeding connector 16 portion in FIG. 8 cut a way in a longitudinal direction. The feeding contact point 22 for feeding a power to the light emitting diode unit 10 is formed on an upper surface at the end of the radiating board 14. The feeding connector 16 has a housing formed by an insulating material such as a resin and two contact springs 17 for feeding a power to the feeding contact point 22. The other end of the contact spring 17 provided below the radiating board 14 is electrically connected to the feeding plug 19. The contact spring 17 holds the feeding contact point 22 portion of the radiating board 14 through the housing by a spring property and is thus connected electrically to the feeding contact point 22. Accordingly, the feeding connector 16 implements a fixation to the radiating board 14 and an electrical connection to the feeding contact point 22 at the substantially same time.

Thus, the power input from the feeding plug 19 is supplied to the light emitting diode unit 10 through the feeding connector 16. However, the electrical connection of the contact spring 17 to the feeding contact point 22 is not restricted to the example, but the contact spring 17 may be soldered to the feeding contact point 22. In any case, a height from the radiating board 14 required for the connection of the contact spring 17 to the feeding contact point 22 is smaller than a height from the radiating board 14 of the input portion 18 into which the feeding plug 19 is to be inserted. Accordingly, the feeding connector 16 has the input portion 18 below the radiating board 14, that is, on the opposite side of the light emitting diode unit 10, and is connected to the feeding contact point 22 at the upper surface of the radiating board 14. Consequently, it is possible to feed a power to the light emitting diode unit 10 without intercepting (or interfering with) the light emitted from the light emitting diode unit 10.

Figure 10:
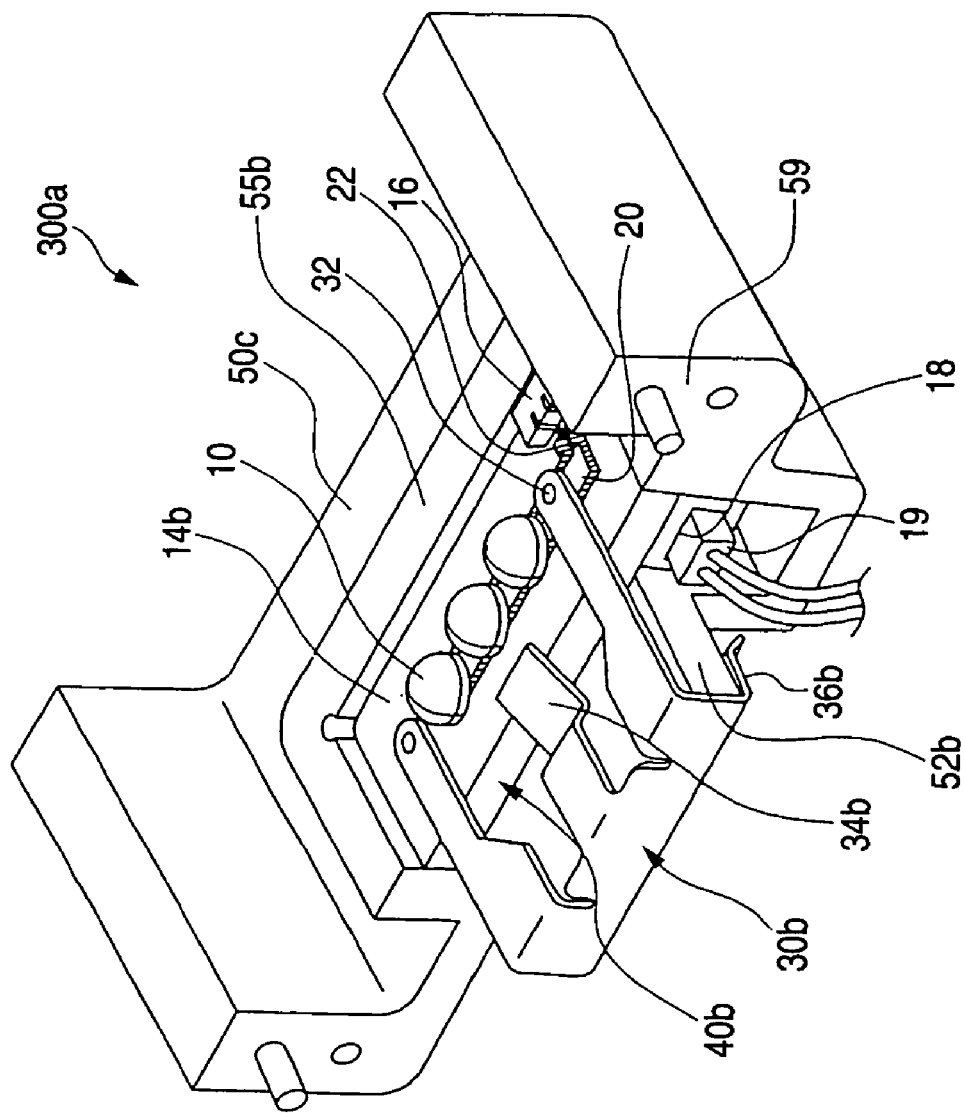
FIG. 10 is a view showing a method of fixing an LED module and feeding a power in the third light source unit 300a, FIG. 11 is a front perspective view showing the first light source unit as seen from the forward part of a lighting unit.

FIG. 10 shows a method of fixing the LED module 40*b* to the LED base 50*c* and feeding a power in the structure of the third light source unit 300*a* according to the exemplary, non-limiting embodiment of the present invention. The same members as those of the first light source unit 10*a* have the same reference numerals and description will be omitted. Moreover, the description of elements having the same structures and functions as those of the first light source unit 100*a* will be omitted.

The LED module 40*b* comprises a plurality of light emitting diode units 10 fixed directly to the upper surface of a radiating board 14*b*. The side surface of the radiating board 14*b* is processed by holding a distance from the reference of the light emitting regions of the light emitting diode units 10 with high precision. The light emitting diode units 10 are connected in series, and the feeding connector 16 feeds a power to the feeding contact point 22 provided on both ends of the wiring 20 for the light emitting diode units 10. By such a structure, the power can be fed efficiently to each of the light emitting diode units 10 mounted on the radiating board 14b.

A wall-shaped abutment portion 55b for positioning the radiating board 14b rearward in a transverse direction with respect to the LED base 50c is provided around the radiating board 14b. The clip 30b for fixing the LED module 40b presses both outer sides of the light emitting diode units 10 arranged in a line in the LED module 40b against the LED base 50c by the upper surface pressing portion 32. A side surface pressing portion 34b provided in the middle of a pair of upper surface pressing portions 32 pushes the vicinity of an almost center of the longitudinal side surface of the radiating board 14b rearward and presses the rear side surface of the radiating board 14 against the abutment portion 55b. Consequently, the LED module 40b is fixed to the LED base 50 in a steady state.

The abutment portion 55b positions the radiating board 14b with high precision in a horizontal direction. By managing dimensions in longitudinal and transverse directions from each of the assembling reference plane 59 to be the attachment reference of the reflector 80c and the positioning projection 57 to the abutment portion 55b with high precision. Accordingly, it is possible to maintain longitudinal and transverse relative positions with respect to the reflector 80c of the light emitting diode unit 10 with high precision. By managing a dimension from a surface on which the LED module 40b is put to the positioning projection 57 with high precision, moreover, it is possible to manage relative positions in a vertical direction of the reflector 80c and the light emitting diode unit 10 with high precision. Accordingly, the third light source unit 300a can forward irradiate a light emitted from the light emitting diode unit 10 with high precision.

Figure 11:
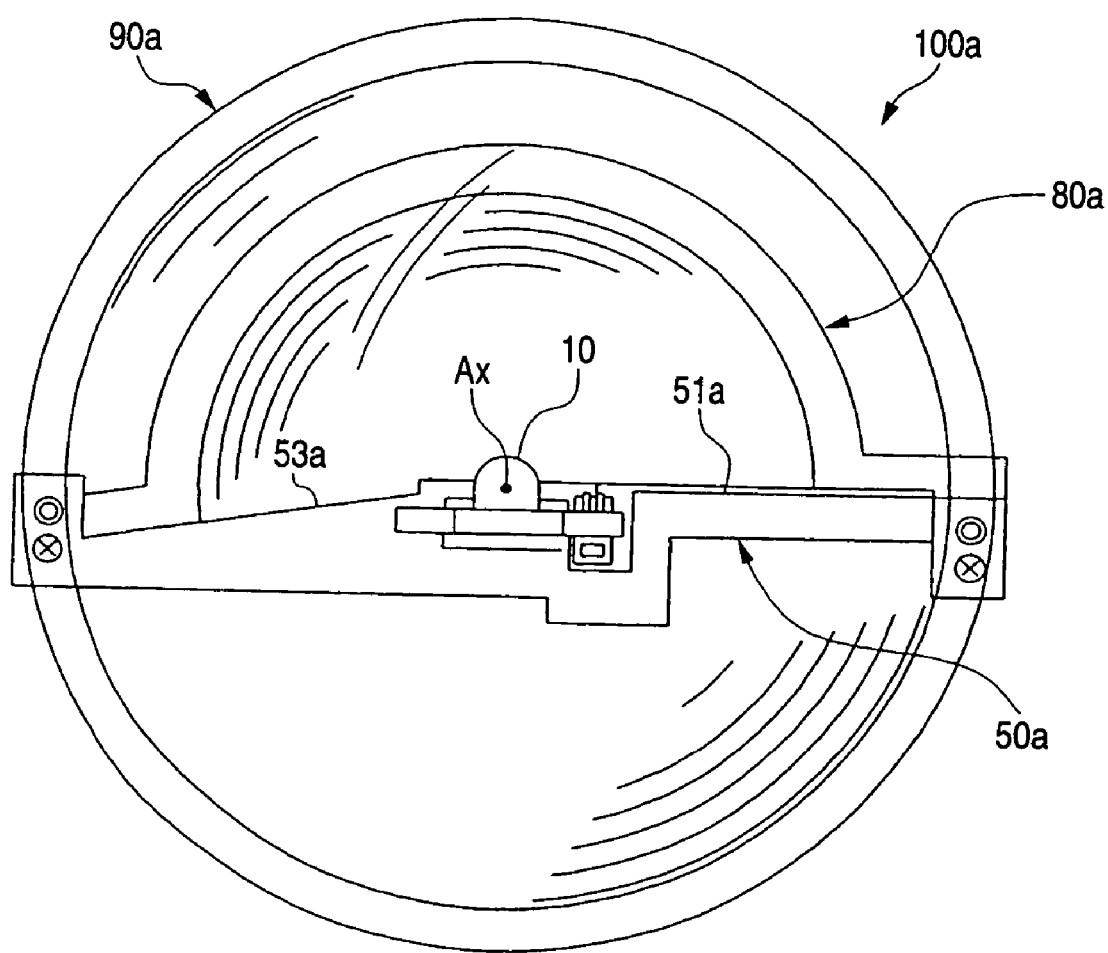

FIG. 11 is a front perspective view showing the first light source unit 100a as seen from the forward part of a lighting unit. The center of the light emitting region of the light emitting diode unit 10 is positioned on an optical axis Ax of the first light source unit 100. The LED base 50a has a base horizontal plane 51a formed in a horizontal direction which passes through the optical axis Ax and a base inclined surface 53a formed with an oblique downward inclination which passes through the optical axis Ax. The reflector 80a covers a portion provided above the light emitting diode unit 10 and is formed in a dome-like shape up to such a position as to substantially come in contact with the base horizontal plane 51a and the base inclined surface 53a. A beam reflected by the reflector 80a and incident on the lens 90a through an optical path along the base horizontal plane 51a and the base inclined surface 53a forms a part of a cut line, as described below.

Figure 12:
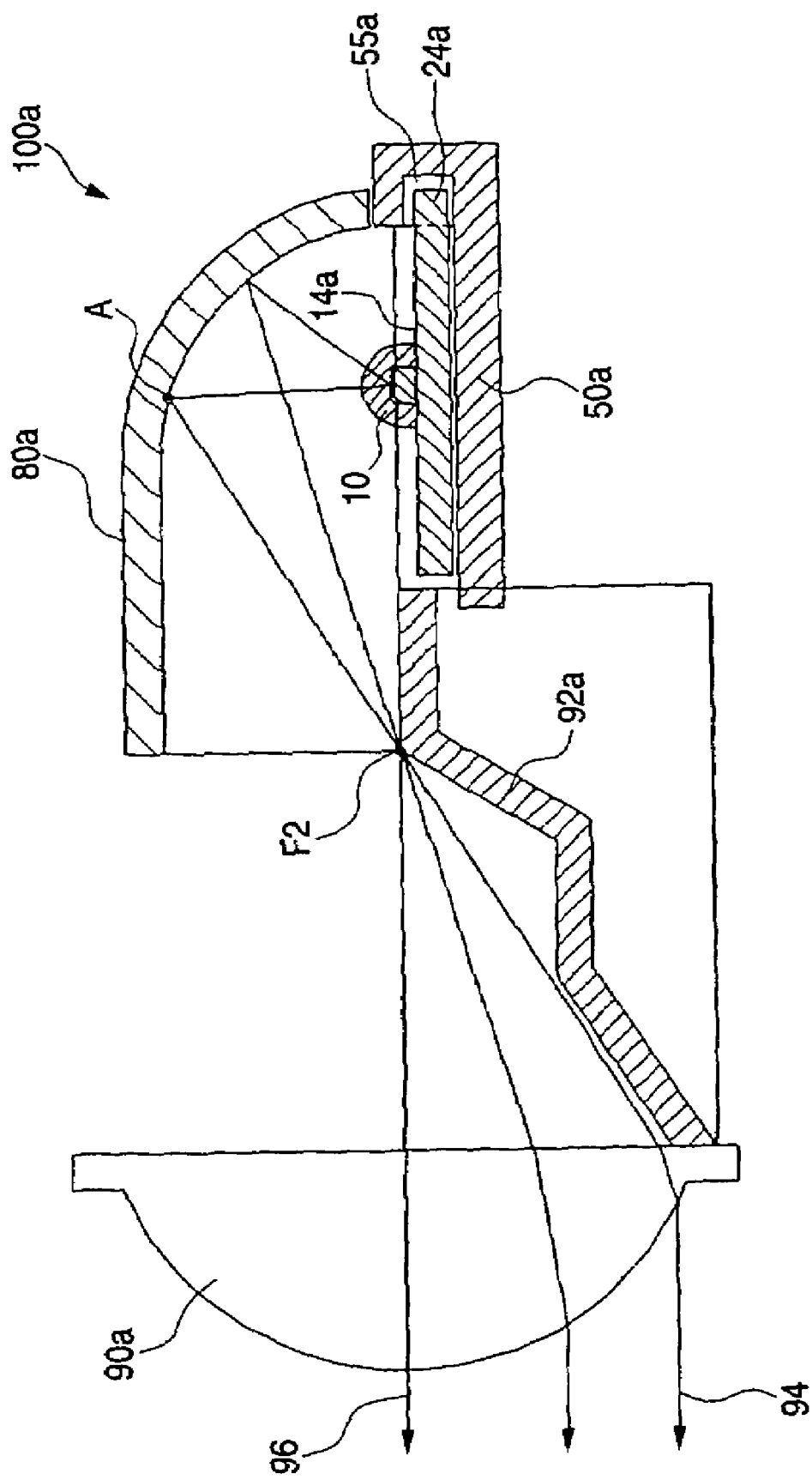
FIG. 12 is a sectional view showing an example of the optical path of the first light source unit.

FIG. 12 is a sectional view showing an example of the optical path of the first light source unit 100a. A reflecting plane formed on the internal surface of the reflector 80a has a sectional shape including the optical axis Ax, which is formed to take a substantially elliptical shape, and is set such that an eccentricity is gradually increased from a vertical section toward a horizontal section. In a section in a perpendicular direction including the optical axis Ax, the lens 90a is provided such manner that a rear side focal position F2 is coincident with the focal position of the reflecting plane of the reflector 80a. The reflector 80a collects the light of the light emitting diode unit 10 into F2 on a rear reflecting plane from a reflecting point A of a beam 94 passing through F2 and incident on the lower end of the lens 90a. The beam 94 is projected on to a lower boundary in the light distribution pattern of the first light source unit 100a.

On the other hand, a beam 96 passing along the optical axis of the lens 90a is projected onto an upper boundary in the light distribution pattern of the first light source unit 100a. A shade 92a provided integrally with the lens 90a is disposed in order to extend the base horizontal surface 51a and the base inclined surface 53a to F2, and an edge falling downward from F2 is formed. Consequently, an optical image formed by the edge of the shade 92a and the reflector 80a on a focal plane including F2 is reflected by the lens 90a and is projected forward.

On the other hand, the focal point of the reflector 80a in a horizontal direction is provided on the lens 90a side from F2. The edge of the shade 92a including F2 has both sides seen from an upper surface curved forward and corresponding to the curvature of field of the reflector 80a, that is, the curvature of a focal plane in a transverse direction. Accordingly, an optical image formed by the forward edge from F2 by the reflection of the reflector 80a is expanded in the transverse direction and is thus inverted and projected by means of the lens 90a.

Figure 13:
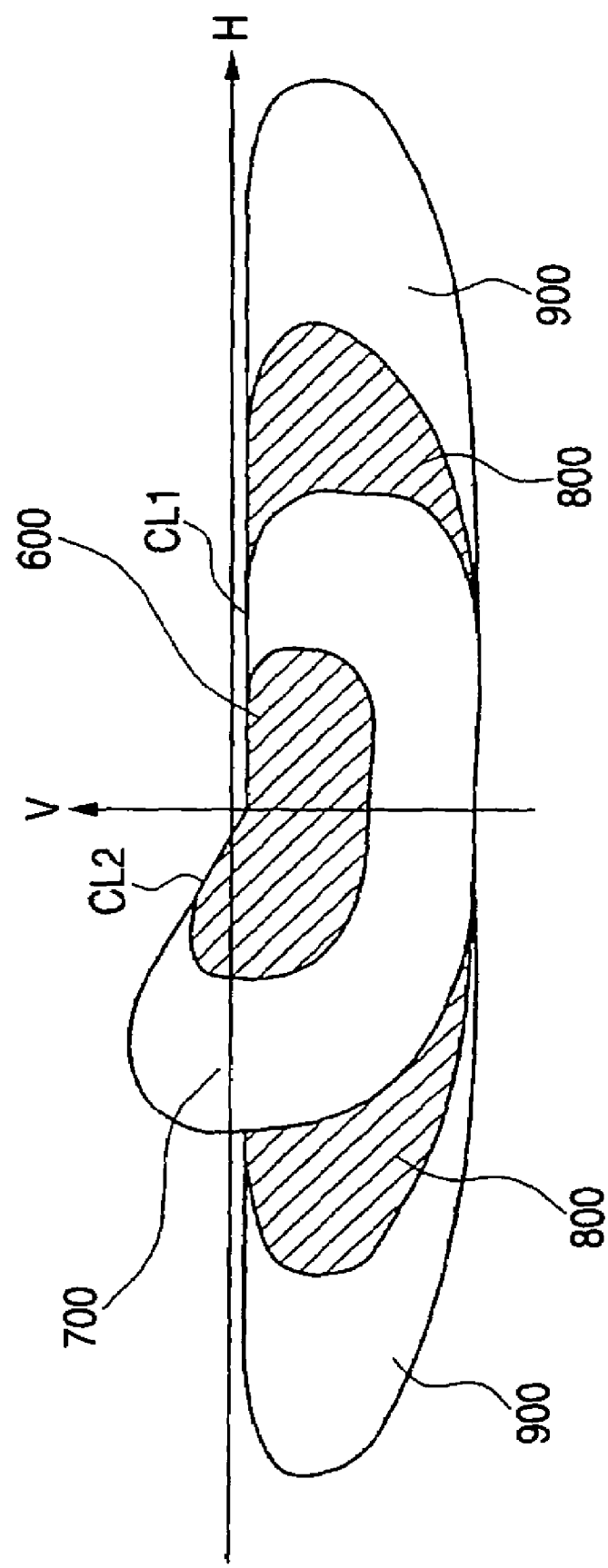
FIG. 13 is a view showing an example of the light distribution pattern of the lighting unit according to an exemplary, non-limiting embodiment of the present invention for a vehicle.

FIG. 13 shows an example of the light distribution pattern of the lighting unit 500 for a vehicle. The light distribution pattern is a left low beam light distribution pattern formed on a virtual vertical screen provided in a forward position of 25 m from the lighting unit. The light distribution pattern is formed as a synthetic light distribution pattern of a first light distribution pattern 600 formed by the first light source unit 100, a second light distribution pattern 700 and a third light distribution pattern 800 which are formed by the second light source unit 200, and a fourth light distribution pattern 900 formed by the third light source unit 300. The light distribution pattern has, on an upper end thereof, a horizontal cut line CL1 and an oblique cut line CL2 which define a brightness boundary in a vertical direction.

The horizontal cut line CL1 is set slightly downward (downward at approximately 0.5 to 0.6 degrees) with respect to the front surface of the lighting unit 500 for a vehicle (the intersecting point of a horizontal axis H—a vertical axis V). The oblique cut line CL2 is inclined leftward and upward at approximately 15 degrees from the intersecting point of the vertical V axis and CL1. The horizontal cut line CL1 in the first light distribution pattern 600 is formed by the horizontal edge of the shade 92a provided on the extended surface of the base horizontal surface 51a. On the other hand, the oblique cut line CL2 is formed by the inclined edge of the shade 92a provided on the extended surface of the base inclined surface 53a. The lighting unit 500 for a vehicle can maintain a visibility in the forward road surface of the vehicle by such a light distribution pattern.

To form the light distribution pattern with high precision in the first light source unit 100, it is important that the relative position of the light emitting diode unit 10 with respect to the reflector 80 and the lens 90 is maintained with high precision. On the other hand, in the light source units (100, 200 and 300) according to the exemplary, non-limiting embodiment, the relative positions of the reflector 80 and lens 90 with the light emitting diode unit 10 are maintained with high precision by the structure described above. For example, but not by way of limitation, in the light emitting diode unit 10, the center of an optical region is aligned with the optical center of the reflector 80 with high precision. Accordingly, the lighting unit 500 for a vehicle can form a light distribution pattern with high precision.

Figure 14:
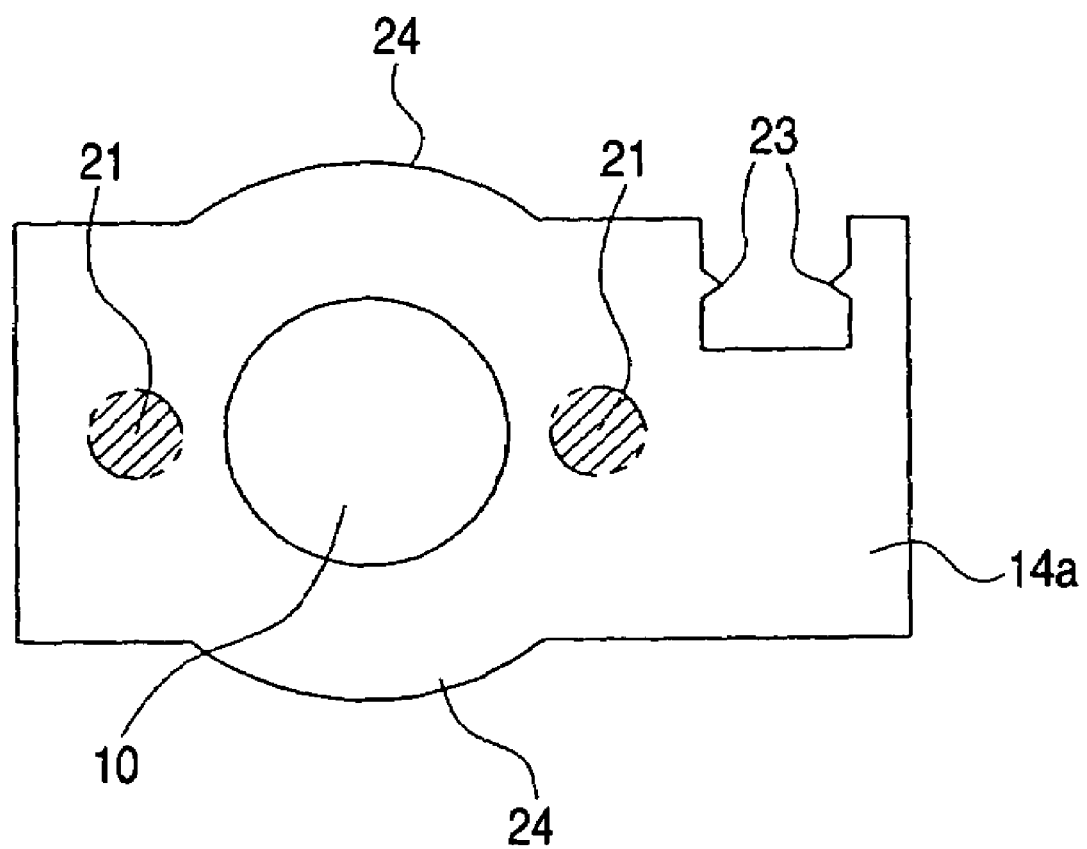
FIG. 14 is a top view showing a radiating board according to an exemplary, non-limiting embodiment of the present invention.

FIG. 14 is a top view showing the radiating board 14a. A notch for incorporating the feeding connector 16 is provided on the end of the radiating board 14a, and projections 23 to be fitted in the housing of the feeding connector 16 are provided opposite to each other on opposed side surfaces at the inside of the notch. The projections 23 are fitted in the side surface of the housing of the feeding connector 16 so that the feeding connector 16 can be prevented from slipping upward in the drawing from the radiating board 14a. In other words, the contact spring 17 holds the radiating board 14a, and the projections 23 are fitted in the external shape of the feeding connector 16 so that the feeding connector 16 can be fixed to the radiating board 14a more stably.

The radiating board 14a is provided with a wiring prohibiting region 21 for prohibiting the arrangement of the wiring 20 on both sides of the light emitting diode unit 10. The wiring prohibiting region 21 might come in contact with the bump 33 when the clip 30a is incorporated in the radiating board 14a. The wiring 20 for supplying a power to the light emitting diode unit 10 is formed in a region other than the wiring prohibiting region 21 on the upper surface of the radiating board 14a. Consequently, the wiring 20 and the clip 30a can be prevented from being short-circuited.

Figure 15:
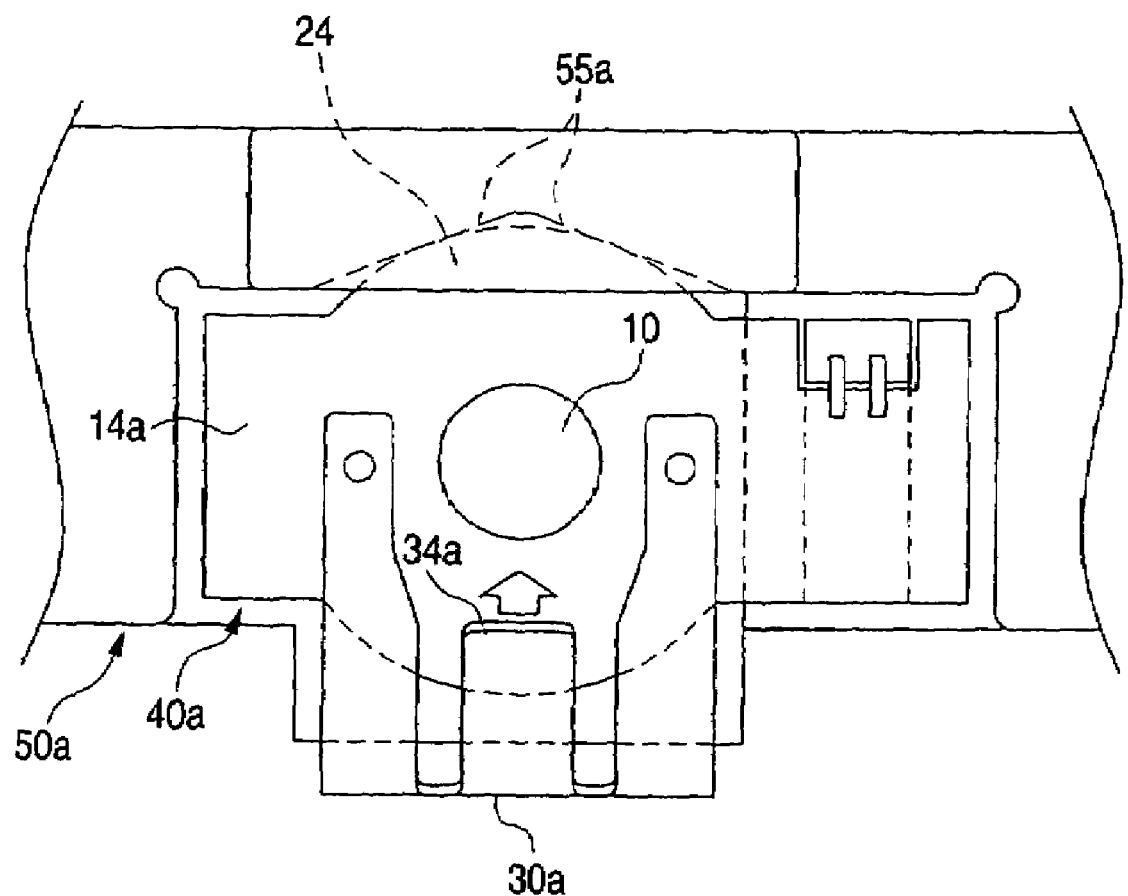
FIG. 15 is a top view showing a state in which an LED module 40a is fixed to an LED base.

FIG. 15 is a top view showing a state in which the LED module 40a is fixed to the LED base 50a. The center of the light emitting region of the light emitting diode unit 10 is provided on the central axis of the circular arc of the arcuate positioning projection 24 disposed on the side surface of the radiating board 14a. The shape of the positioning projection 24 is processed with high precision by setting the center of the light emitting region of the light emitting diode unit 10 to be a reference. Moreover, the side surface pressing portion 34a of the clip 30a pushes the side surface of the radiating board 14a rearward from the lighting unit so that the positioning projection 24 comes in contact with two wall surfaces taking an almost V shape of the abutment portion 55a, respectively. Consequently, the center of the circular arc of the positioning projection 24 is positioned with respect to the abutment portion 55a. The center of the light emitting region of the light emitting diode unit 10 is managed on the central axis of the circular arc of the positioning projection 24 with high precision as described above. Accordingly, the center of the light emitting region of the light emitting diode unit 10 is positioned with respect to the abutment portion 55a with high precision.

Figure 16:
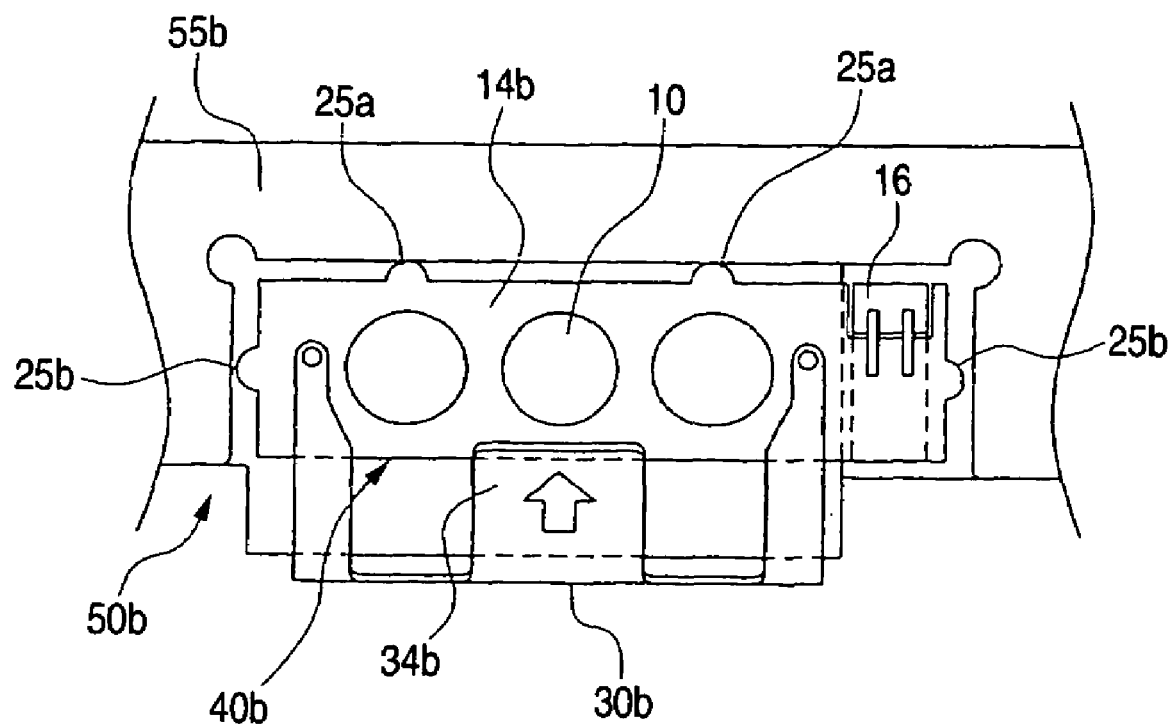
FIG. 16 is a top view showing a state in which the LED module 40b is fixed to an LED base.

FIG. 16 is a top view showing a state in which the LED module 40b is fixed to an LED base 50b. The radiating board 14b has two positioning projections 25a and two positioning projections 25b on a rearward side surface and left and right side surfaces, respectively. In the positioning projection 25a, a position in a longitudinal direction from the reference of the light emitting region of the light emitting diode unit 10 is managed with high precision. Accordingly, the side surface pressing portion 34b presses the side surfaces of the radiating board 14b rearward so that the positioning projection 25a abuts on the abutment portion 55 band the reference of the light emitting region of the light emitting diode unit 10 is thus positioned with high precision in a longitudinal direction with respect to the abutment portion 55b. A position in the longitudinal direction of the reflector 80c is managed with high precision with respect to the abutment portion 55b. Accordingly, relative positions in the longitudinal direction of the reference of the light emitting region of the LED module 40b and the reflector 80 care determined with high precision. Consequently, the third light source unit 300 can form the fourth light distribution pattern 900 with high precision.

On the other hand, the positioning projections 25b protruded in the transverse direction of the radiating board 14 have a dimension from the reference of the light emitting region of the light emitting diode unit 10 managed with high precision. By providing an interval in the transverse direction of the abutment portion 55b to be almost equal to a distance between the tips of the left and right positioning projections 25b, accordingly, it is possible to position the reference of the light emitting region of the light emitting diode unit 10 with high precision in the transverse direction with respect to the abutment portion 55b.

Figure 17:
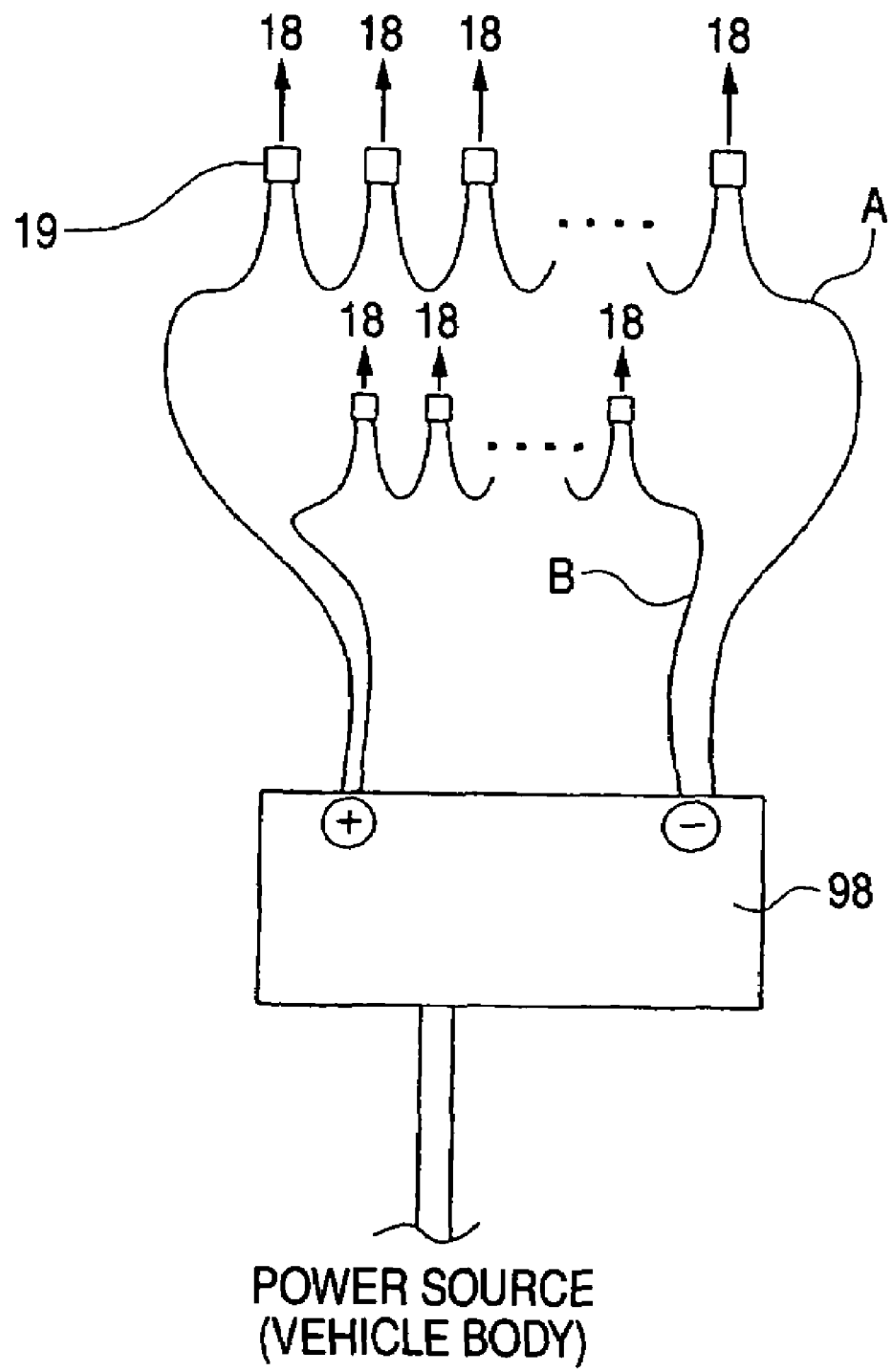
FIG. 17 is a conceptual view showing the wiring image of a feeding plug according to an exemplary, non-limiting embodiment of the present invention.

FIG. 17 is a conceptual view showing the wiring image of the feeding plugs 19. The feeding plugs 19 are connected by a serial 2-system (A, B) wiring. Each of the feeding plugs 19 is inserted into the input portion 18 of the feeding connector 16, thereby feeding power to each light emitting diode unit 10. The systems A and B supply power to the same number of light emitting diode units 10, respectively. A current is supplied from the power supply of a body to the systems A and B through a ballast resistor 98. The ballast resistor 98 uniformly compensates for the current of each of the systems A and B, there by maintaining a current to be supplied to each light emitting diode unit 10 to be even and thus holding the luminance level of the light emitting diode unit 10 to be uniform.

Figure 18:
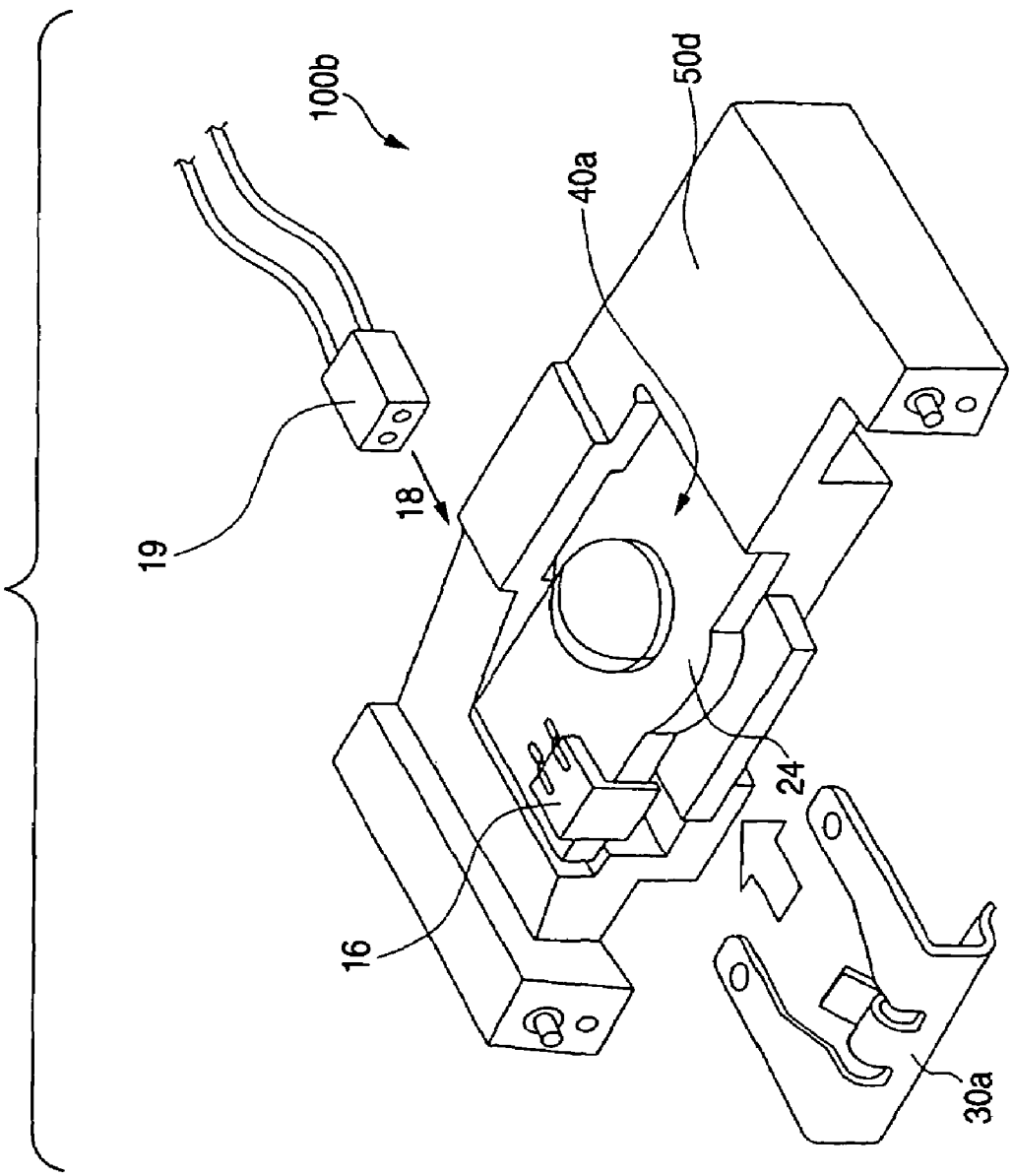
FIG. 18 is a view showing a second example of the method of fixing the light emitting diode unit and feeding a power.

FIG. 18 is a view showing a second example of the method of fixing the light emitting diode unit 10 and feeding power. In the example, the same LED module 40a as that of the first example is attached to an LED base 50d in a state in which it is rotated at 180 degrees in a horizontal direction. The LED base 50d is provided with a groove for accommodating the feeding connector 16 on a left side seen from the forward part of the lighting unit corresponding to the direction of the feeding connector 16. An opening portion (not shown) for releasing the input portion 18 of the feeding connector 16 is provided behind the groove, and the feeding plug 19 is inserted through the opening portion from behind the LED base 50d and is connected to the input portion 18.

The positioning projection 24 is provided to be a rotating object around the light emitting diode unit 10. Even if the LED module 40a is rotated at 180 degrees, the light emitting diode unit 10 is positioned in abutment on the abutment portion 55a in the same manner as in the first example. In the same manner as in the first example, the clip 30a can also position and fix the LED module 40a in vertical and horizontal directions with respect to the LED base 50d.

In the example, the feeding plug 19 is inserted from behind the LED base 50d. For this reason, the feeding plug 19 and a cord thereof cannot be seen from the forward part of the lighting unit. Accordingly, the appearance of the lighting unit can be advantageously obtained. Furthermore, a blindfold for the feeding plug 19 and the cord is not required. Consequently, it is possible to produce an advantage that the number of components can be reduced, and the degree of freedom of the shape of the shade 92 can be enhanced.

Figure 19:
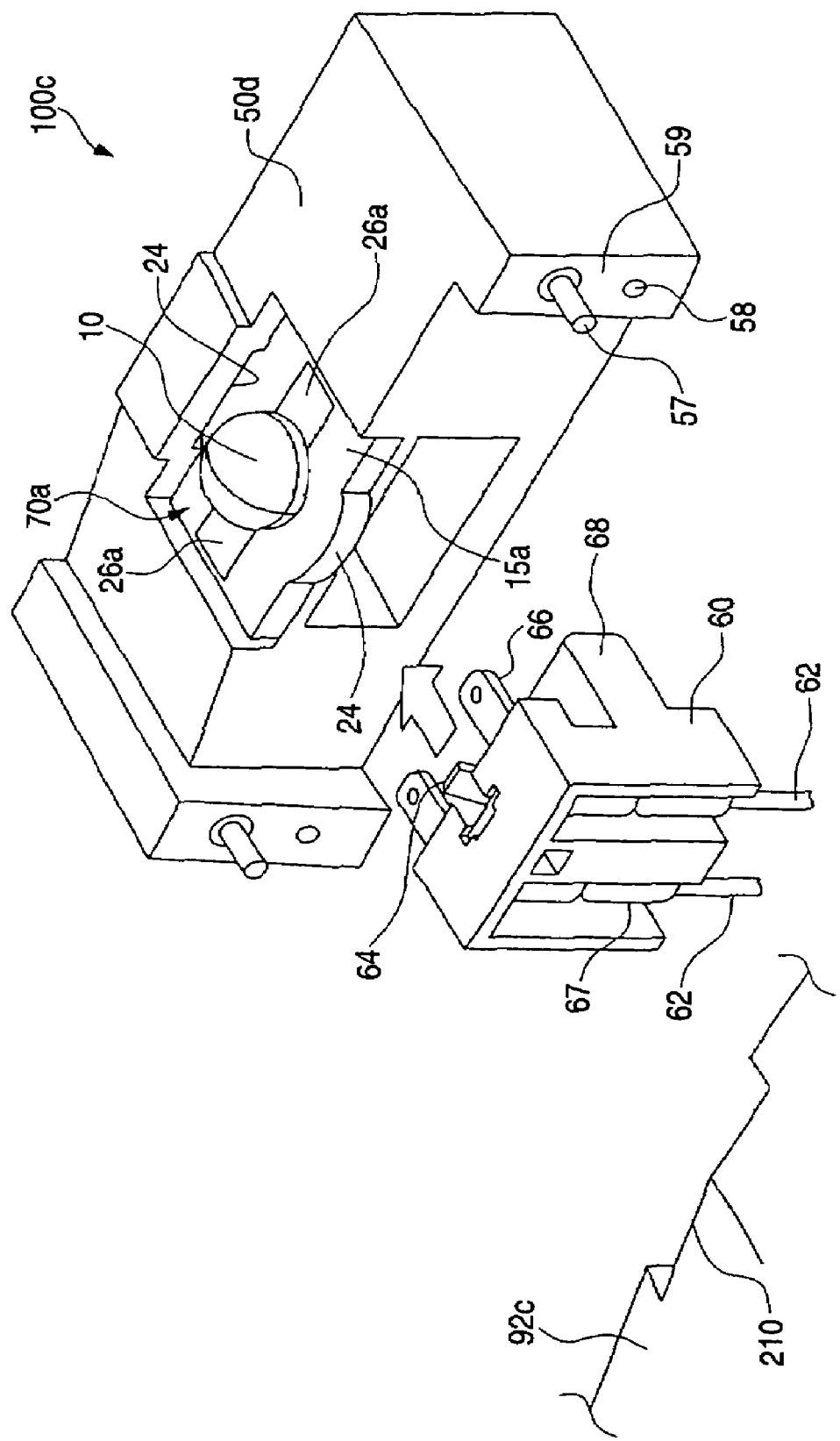
FIG. 19 is a view showing a third example of the method of fixing the light emitting diode unit and feeding a power.

FIG. 19 is a view showing a third example of the method of fixing the light emitting diode unit 10 and feeding power. In the example, a clip connector 60 is provided in place of the clip 30, the feeding connector 16 and the feeding plug 19 in the first example. Moreover, a radiating board 15a and the LED base 50d are provided in place of the radiating board 14a and the LED base 50a. The same components as those in the first example have the same reference numerals and description will be omitted. The portions not described have the substantially same structures and functions as those in the first example.

The light emitting diode unit 10 is directly fixed to the upper surface of the radiating board 15a formed by a material having a high thermal conductivity such as a metal or ceramic. A feeding contact point 26a for supplying a power to the light emitting diode unit 10 is further provided at both sides on the upper surface of the radiating board 15a with the light emitting diode unit 10 interposed therebetween in a transverse direction. The LED base 50d directly supports at least the lower surface of a portion in which the feeding contact point 26a of the radiating board 15a is formed.

The clip connector 60 holds the feeding contact point 26a portion of the radiating board 15a and the LED board 50d, thereby fixing the radiating board 15a to the LED base 50d and carrying out an electrical connection to the feeding contact point 26a. More specifically, the clip connector 60 has a pair of spring terminals 66 pressing the feeding contact points 26a downward and a base engaging portion 68 provided opposite to the spring terminals 66 and engaged with the lower surface of the LED base 50d. The LED base 50d is provided with a cavity corresponding to the shape of the base engaging portion 68 below a support portion for directly supporting the lower surface of the radiating board 15a. The clip connector 60 interposes the back side of the support portion in the cavity and the feeding contact point 26a portion of the radiating board 15a with the base engaging portion 68 and the spring terminals 66.

The feeding contact point 26a is provided on both sides of the light emitting diode unit 10. Therefore, positive and negative wirings can easily be led out of the light emitting diode unit 10. Furthermore, the radiating board 15a is fixed to the LED base 50d stably. A side surface pressing portion 64 for rearwardly pressing the positioning projections 24 provided on the side surfaces of the radiating board 15a is disposed in the middle of the spring terminals 66. The side surface pressing portion 64 presses the positioning projections 24 rearwardly so that the positioning projection 24 provided on the inner side of the radiating board 15a is positioned by the abutment portion 55 with high precision, and the light emitting diode unit 10 is thus positioned with high precision with respect to the abutment portion 55a.

A feeding cord 62 for feeding a power to the light emitting diode unit 10 is connected to each of the spring terminals 66 through a caulked portion 67. The rear end of a shade 92c is provided with a shade abutment portion 210 for abutting on the side surface of the clip connector 60 in the forward part of a lighting unit, thereby preventing the clip connector 60 from slipping from the LED base 50d. The shade 92c is screwed to a screw hole 58 of the assembling reference plane 59. Even if the shock or vibration of a vehicle is applied to the clip connector 60, therefore, it does not slip from the LED base 50d. Accordingly, it is possible to stably maintain the positioning and fixation of an LED module 70a to the LED base 50d and the supply of a power to the light emitting diode unit 10.

Figure 20:
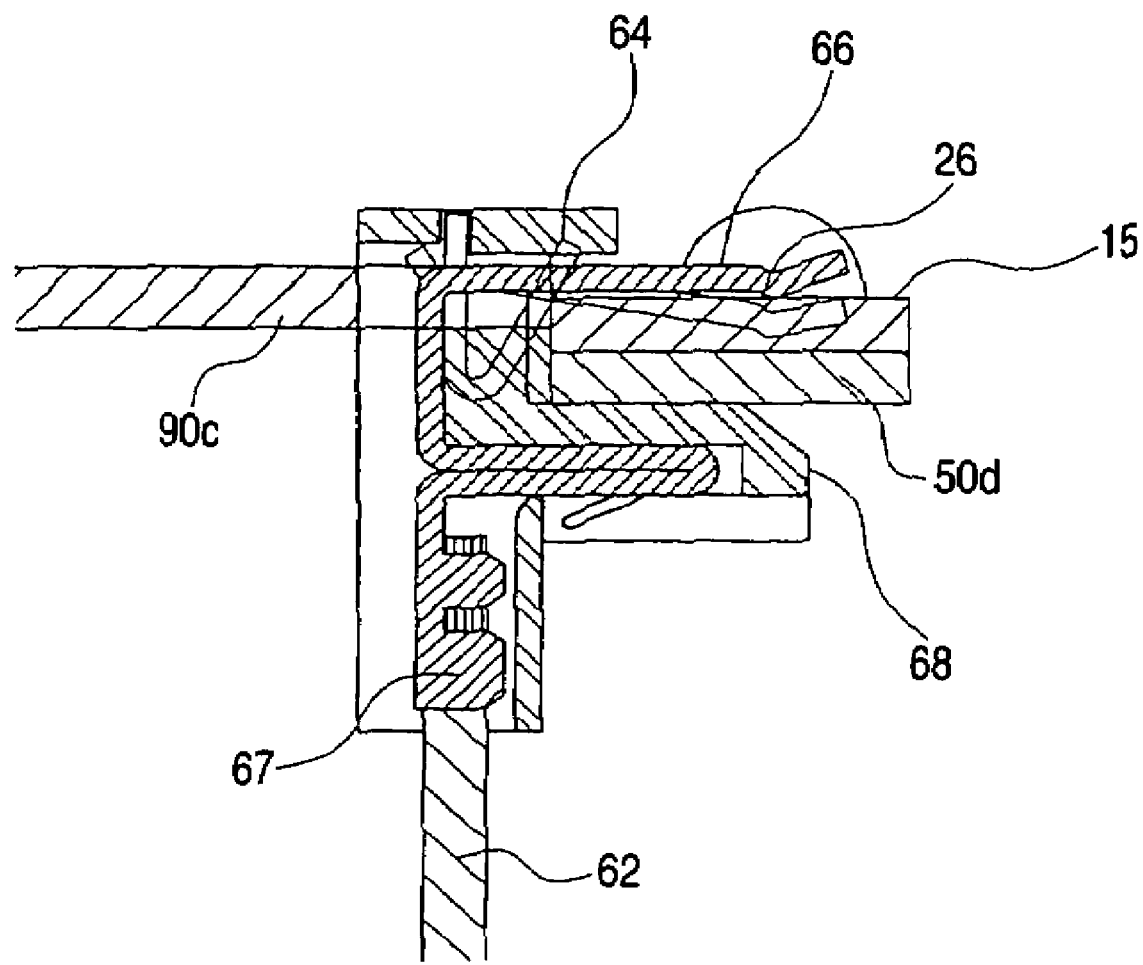
FIG. 20 is a vertical sectional view in a longitudinal direction including a spring terminal according to the third exemplary, non-limiting embodiment of the present invention.

FIG. 20 is a vertical sectional view in a longitudinal direction including the contact point of the spring terminal 66 and the feeding contact point 26 according to the exemplary, non-limiting embodiment. A bump protruded in the direction of the feeding contact point 26 is formed on an end at the upper side of the spring terminal 66, and a contact with the feeding contact point 26 is carried out in the same bump portion. The spring terminal 66 interposes the radiating board 15 and the LED base 50d in an almost U shape through the housing of the clip connector 60. The housing is formed by an insulating material such as plastic. An upper surface on the tip of the base engaging portion 68 of the housing is chamfered, and the chamfer guides the clip connector 60 when the clip connector 60 is to be incorporated in the LED base 50d.

The other end of the spring terminal 66 forms the caulked portion 67, which is caulked with respect to the exposed conductor portion of the feeding cord 62 below the radiating board 15. The feeding cord 62 is extended downward from the caulked portion 67. The caulked portion 67 and the feeding cord 62 are provided below the radiating board 15. Therefore, the clip connector 60 can supply power to the light emitting diode unit 10 without intercepting light emitted from the light emitting diode unit 10.

Figure 21:
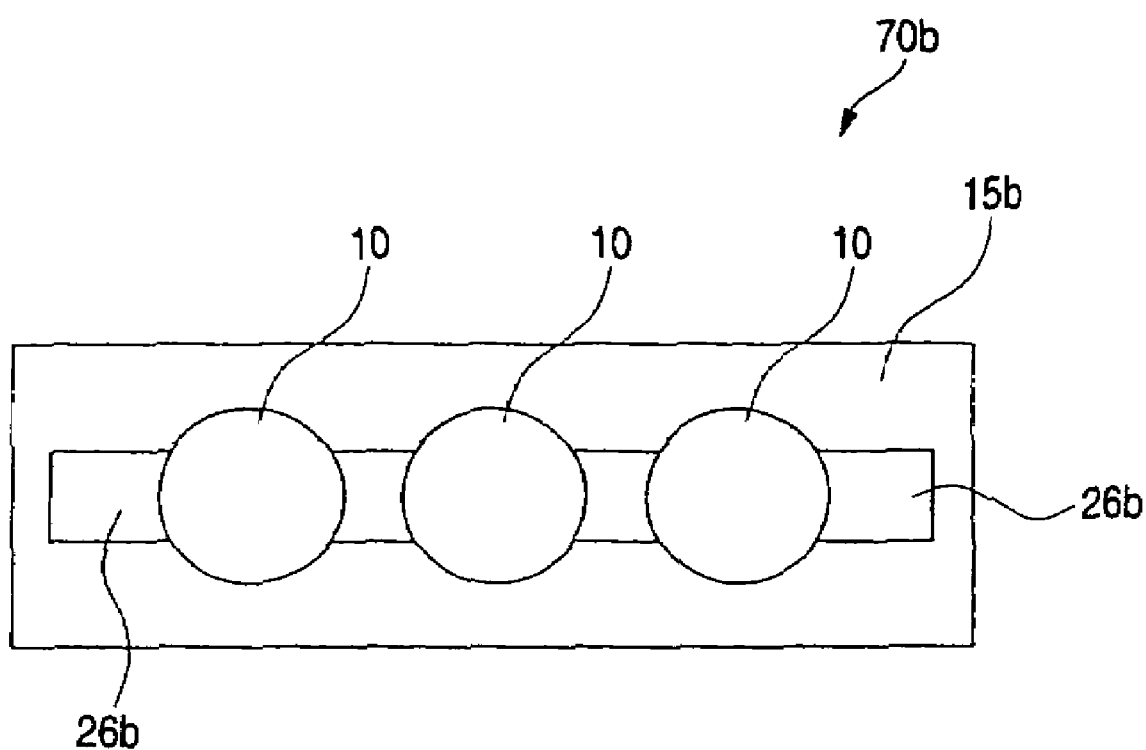
FIG. 21 is a top view showing an LED module 70b to be used in a third light source unit 300b according to the third exemplary, non-limiting embodiment of the present invention.

FIG. 21 is a top view showing an LED module 70b to be used for a third light source unit 300b according to the exemplary, non-limiting embodiment. In the LED module 70b, three light emitting diode units 10 are mounted on a radiating board 15b. The three light emitting diode units 10 are connected in series and feeding contact points 26b for supplying a power to the light emitting diode unit 10 are formed on both sides of a wiring thereof. In a clip connector 60b which is not shown, the pitch of the spring terminal 66 is increased corresponding to an interval between the feeding contact points 26b. The clip connector 60b supplies a power to a pair of feeding contact points 26b connected to both ends of the light emitting diode units 10 so that the power can be efficiently fed to all of the light emitting diode units 10.

As is apparent from the above description, according to the exemplary, non-limiting embodiment of the present invention, the lighting unit 500 can efficiently utilize the light emitted from the light emitting diode unit 10, and furthermore, can prevent a luminance from being reduced by a heat. By maintaining the relative positions of the light emitting diode unit 10 with the optical system with high precision, moreover, it is possible to form a light distribution pattern with high precision.

While the invention has been described above with reference to the embodiment, the technical range of the invention is not restricted to the range described in the embodiment. It is apparent to the skilled in the art that various changes or improvements can be made in the embodiment. It is apparent from the appended claims that the embodiment thus changed or improved can also be included in the technical range of the invention.

The invention claimed is:

1. A lighting unit for illumination, comprising:
   a semiconductor light emitting unit;
   a plate-shaped radiating board having an upper surface to which the semiconductor light emitting unit is directly fixed; and
   a feeding connector disposed on an end of the radiating board, the feeding connector comprising an input portion that is disposed below the radiating board,
   wherein the input portion is configured to accept input power for the semiconductor light emitting unit;
   further comprising a wiring disposed on the upper surface of the radiating board, the wiring extending substantially from a point where the semiconductor light emitting unit is fixed and connecting to the feeding connector at the end of the radiating board.

2. The lighting unit according to claim 1, further comprising:
   a feeding contact point formed on the upper surface at the end of the radiating board, the feeding contact point configured to accept supply power for the semiconductor light emitting unit,
   wherein the feeding connector is configured to hold the feeding contact point portion of the radiating board, thereby making an electrical connection between the input portion and the feeding contact point.

3. The lighting unit according to claim 1, further comprising a plurality of semiconductor light emitting units fixed to the upper surface of the radiating board and coupled in series, the feeding connector supplying the power to a first wiring end and a second wiring end of the semiconductor light emitting unit.

4. The lighting unit according to claim 1, wherein said semiconductor light emitting unit is attached to said plate-shaped radiating board via a clip.

5. The lighting unit according to claim 4, wherein said clip includes a plurality of bumps that contact said plate-shaped radiating board at non-conducting areas of the radiating board.

6. The lighting unit of claim 1, wherein said power is input via a feeding cord that is connected to terminals via a clip connector.

7. The lighting unit of claim 1, wherein said feeding connector receives a feeding plug in a location that does not interfere with light emission.

8. The lighting unit of claim 1, wherein the radiating board is thermally conductive and composed of an electrically conductive material with an insulating film disposed on top of the conductive material.

9. The lighting unit of claim 1, wherein the radiating board is thermally conductive and composed of an electrically non-conductive material.

10. A lighting unit for illumination, comprising:
a semiconductor light emitting unit;
a plate-shaped radiating board having an upper surface to which the semiconductor light emitting unit is directly fixed; and
a feeding connector disposed on an end of the radiaing board, the feeding connector comprising an input portion that is disposed below the radiating board,
wherein the input portion is configured to accept input power for the semiconductor light emiting unit, and
wherein the radiating board has, on a side surface, a positioning projection configured to position the semiconductor light emitting unit at a predetermined reference position in the lighting unit.

11. The lighting unit according to claim 10, wherein the reference position is based on a center of a light emitting region of the semiconductor light emitting unit.

* * * * *